| (12) | United States Patent | (10) Patent No.: | US 9,935,075 B2 |
|---|---|---|---|
| | Huang et al. | (45) Date of Patent: | Apr. 3, 2018 |

(54) WIRE BONDING METHOD AND APPARATUS FOR ELECTROMAGNETIC INTERFERENCE SHIELDING

(71) Applicant: Invensas Corporation, San Jose, CA (US)

(72) Inventors: Shaowu Huang, Sunnyvale, CA (US); Javier A. Delacruz, Santa Clara, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/237,936

(22) Filed: Aug. 16, 2016

(65) Prior Publication Data

US 2018/0033764 A1 Feb. 1, 2018

Related U.S. Application Data

(60) Provisional application No. 62/368,423, filed on Jul. 29, 2016.

(51) Int. Cl.
*H01L 23/552* (2006.01)
*H01L 23/00* (2006.01)
(Continued)

(52) U.S. Cl.
CPC ............ *H01L 24/49* (2013.01); *H01L 21/565* (2013.01); *H01L 23/3114* (2013.01);
(Continued)

(58) Field of Classification Search
CPC ....... H01L 24/49; H01L 24/85; H01L 21/565; H01L 23/3114; H01L 23/552
See application file for complete search history.

(56) References Cited

U.S. PATENT DOCUMENTS

| 3,289,452 A | 12/1966 | Koellner |
| 3,358,897 A | 12/1967 | Christensen |
| (Continued) | | |

FOREIGN PATENT DOCUMENTS

| CN | 1352804 A | 6/2002 |
| CN | 1641832 A | 7/2005 |
| (Continued) | | |

OTHER PUBLICATIONS

U.S. Office Action for U.S. Appl. No. 12/769,930, dated May 5, 2011.

(Continued)

*Primary Examiner* — Jamie C Niesz

(57) ABSTRACT

Apparatuses relating generally to a microelectronic package having protection from electromagnetic interference are disclosed. In an apparatus thereof, a platform has an upper surface and a lower surface opposite the upper surface and has a ground plane. A microelectronic device is coupled to the upper surface of the platform. Wire bond wires are coupled to the ground plane with a pitch. The wire bond wires extend away from the upper surface of the platform with upper ends of the wire bond wires extending above an upper surface of the microelectronic device. The wire bond wires are spaced apart from one another to provide a fence-like perimeter to provide an interference shielding cage. A conductive layer is coupled to at least a subset of the upper ends of the wire bond wires for electrical conductivity to provide a conductive shielding layer to cover the interference shielding cage.

20 Claims, 14 Drawing Sheets

(51) Int. Cl.
*H01L 21/56* (2006.01)
*H01L 23/31* (2006.01)

(52) U.S. Cl.
CPC ............ *H01L 23/552* (2013.01); *H01L 24/85* (2013.01); *H01L 2224/49097* (2013.01); *H01L 2224/49179* (2013.01); *H01L 2924/3025* (2013.01)

(56) References Cited

U.S. PATENT DOCUMENTS

| | | |
|---|---|---|
| 3,430,835 A | 3/1969 | Grable et al. |
| 3,623,649 A | 11/1971 | Keisling |
| 3,795,037 A | 3/1974 | Luttmer |
| 3,900,153 A | 8/1975 | Beerwerth et al. |
| 4,067,104 A | 1/1978 | Tracy |
| 4,072,816 A | 2/1978 | Gedney et al. |
| 4,213,556 A | 7/1980 | Persson et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,642,889 A | 2/1987 | Grabbe |
| 4,667,267 A | 5/1987 | Hernandez et al. |
| 4,695,870 A | 9/1987 | Patraw |
| 4,716,049 A | 12/1987 | Patraw |
| 4,725,692 A | 2/1988 | Ishii et al. |
| 4,771,930 A | 9/1988 | Gillotti et al. |
| 4,793,814 A | 12/1988 | Lifcak et al. |
| 4,804,132 A | 2/1989 | DiFrancesco |
| 4,845,354 A | 7/1989 | Gupta et al. |
| 4,902,600 A | 2/1990 | Tamagawa et al. |
| 4,924,353 A | 5/1990 | Patraw |
| 4,925,083 A | 5/1990 | Farassat et al. |
| 4,955,523 A | 9/1990 | Carlommagno et al. |
| 4,975,079 A | 12/1990 | Beaman et al. |
| 4,982,265 A | 1/1991 | Watanabe et al. |
| 4,998,885 A | 3/1991 | Beaman et al. |
| 4,999,472 A | 3/1991 | Neinast et al. |
| 5,067,007 A | 11/1991 | Otsuka et al. |
| 5,067,382 A | 11/1991 | Zimmerman et al. |
| 5,083,697 A | 1/1992 | DiFrancesco |
| 5,095,187 A | 3/1992 | Gliga |
| 5,133,495 A | 7/1992 | Angulas et al. |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,203,075 A | 4/1993 | Angulas et al. |
| 5,214,308 A | 5/1993 | Nishiguchi et al. |
| 5,220,489 A | 6/1993 | Barreto et al. |
| 5,222,014 A | 6/1993 | Lin |
| 5,238,173 A | 8/1993 | Ura et al. |
| 5,241,454 A | 8/1993 | Ameen et al. |
| 5,241,456 A | 8/1993 | Marcinkiewicz et al. |
| 5,316,788 A | 5/1994 | Dibble et al. |
| 5,340,771 A | 8/1994 | Rostoker |
| 5,346,118 A | 9/1994 | Degani et al. |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,468,995 A | 11/1995 | Higgins, III |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,578,869 A | 11/1996 | Hoffman et al. |
| 5,608,265 A | 3/1997 | Kitano et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,718,361 A | 2/1998 | Braun et al. |
| 5,726,493 A | 3/1998 | Yamashita et al. |
| 5,731,709 A | 3/1998 | Pastore et al. |
| 5,736,780 A | 4/1998 | Murayama |
| 5,736,785 A | 4/1998 | Chiang et al. |
| 5,766,987 A | 6/1998 | Mitchell et al. |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,830,389 A | 11/1998 | Capote et al. |
| 5,831,836 A | 11/1998 | Long et al. |
| 5,839,191 A | 11/1998 | Economy et al. |
| 5,854,507 A | 12/1998 | Miremadi et al. |
| 5,874,781 A | 2/1999 | Fogal et al. |
| 5,898,991 A | 5/1999 | Fogel et al. |
| 5,908,317 A | 6/1999 | Heo |
| 5,912,505 A | 6/1999 | Itoh et al. |
| 5,948,533 A | 9/1999 | Gallagher et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,980,270 A | 11/1999 | Fjelstad et al. |
| 5,989,936 A | 11/1999 | Smith et al. |
| 5,994,152 A | 11/1999 | Khandros et al. |
| 6,000,126 A | 12/1999 | Pai |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,145,733 A | 11/2000 | Streckfuss et al. |
| 6,157,080 A | 12/2000 | Tamaki et al. |
| 6,158,647 A | 12/2000 | Chapman et al. |
| 6,164,523 A | 12/2000 | Fauty et al. |
| 6,168,965 B1 | 1/2001 | Malinovich et al. |
| 6,177,636 B1 | 1/2001 | Fjelstad |
| 6,180,881 B1 | 1/2001 | Isaak |
| 6,194,250 B1 | 2/2001 | Melton et al. |
| 6,194,291 B1 | 2/2001 | DiStefano et al. |
| 6,202,297 B1 | 3/2001 | Farad et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,211,574 B1 | 4/2001 | Tao et al. |
| 6,215,670 B1 | 4/2001 | Khandros |
| 6,218,728 B1 | 4/2001 | Kimura |
| 6,225,688 B1 | 5/2001 | Kim et al. |
| 6,238,949 B1 | 5/2001 | Nguyen et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,268,662 B1 | 7/2001 | Test et al. |
| 6,295,729 B1 | 10/2001 | Beaman et al. |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,329,224 B1 | 12/2001 | Nguyen et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,376,769 B1 | 4/2002 | Chung |
| 6,388,333 B1 | 5/2002 | Taniguchi et al. |

(56) References Cited

U.S. PATENT DOCUMENTS

| | | |
|---|---|---|
| 6,395,199 B1 | 5/2002 | Krassowski et al. |
| 6,399,426 B1 | 6/2002 | Capote et al. |
| 6,407,448 B2 | 6/2002 | Chun |
| 6,407,456 B1 | 6/2002 | Ball |
| 6,410,431 B2 | 6/2002 | Bertin et al. |
| 6,413,850 B1 | 7/2002 | Ooroku et al. |
| 6,439,450 B1 | 8/2002 | Chapman et al. |
| 6,458,411 B1 | 10/2002 | Goossen et al. |
| 6,469,260 B2 | 10/2002 | Horiuchi et al. |
| 6,469,373 B2 | 10/2002 | Funakura et al. |
| 6,476,503 B1 | 11/2002 | Imamura et al. |
| 6,476,506 B1 | 11/2002 | O'Connor |
| 6,476,583 B2 | 11/2002 | McAndrews |
| 6,486,545 B1 | 11/2002 | Glenn et al. |
| 6,489,182 B2 | 12/2002 | Kwon |
| 6,489,676 B2 | 12/2002 | Taniguchi et al. |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,550,666 B2 | 2/2003 | Chew et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,555,918 B2 | 4/2003 | Masuda et al. |
| 6,560,117 B2 | 5/2003 | Moon |
| 6,563,205 B1 | 5/2003 | Fogal et al. |
| 6,563,217 B2 | 5/2003 | Corisis et al. |
| 6,573,458 B1 | 6/2003 | Matsubara et al. |
| 6,578,754 B1 | 6/2003 | Tung |
| 6,581,276 B2 | 6/2003 | Chung |
| 6,581,283 B2 | 6/2003 | Sugiura et al. |
| 6,624,653 B1 | 9/2003 | Cram |
| 6,630,730 B2 | 10/2003 | Grigg |
| 6,639,303 B2 | 10/2003 | Siniaguine |
| 6,647,310 B1 | 11/2003 | Yi et al. |
| 6,650,013 B2 | 11/2003 | Yin et al. |
| 6,653,170 B1 | 11/2003 | Lin |
| 6,684,007 B2 | 1/2004 | Yoshimura et al. |
| 6,686,268 B2 | 2/2004 | Farnworth et al. |
| 6,687,988 B1 | 2/2004 | Sugiura et al. |
| 6,693,363 B2 | 2/2004 | Tay et al. |
| 6,696,305 B2 | 2/2004 | Kung et al. |
| 6,699,730 B2 | 3/2004 | Kim et al. |
| 6,708,403 B2 | 3/2004 | Beaman et al. |
| 6,720,783 B2 | 4/2004 | Satoh et al. |
| 6,730,544 B1 | 5/2004 | Yang |
| 6,733,711 B2 | 5/2004 | Durocher et al. |
| 6,734,539 B2 | 5/2004 | Degani et al. |
| 6,734,542 B2 | 5/2004 | Nakatani et al. |
| 6,740,980 B2 | 5/2004 | Hirose |
| 6,740,981 B2 | 5/2004 | Hosomi |
| 6,746,894 B2 | 6/2004 | Fee et al. |
| 6,754,407 B2 | 6/2004 | Chakravorty et al. |
| 6,756,252 B2 | 6/2004 | Nakanishi |
| 6,756,663 B2 | 6/2004 | Shiraishi et al. |
| 6,759,738 B1 | 7/2004 | Fallon et al. |
| 6,762,078 B2 | 7/2004 | Shin et al. |
| 6,765,287 B1 | 7/2004 | Lin |
| 6,774,317 B2 | 8/2004 | Fjelstad |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,777,797 B2 | 8/2004 | Egawa |
| 6,778,406 B2 | 8/2004 | Eldridge et al. |
| 6,787,926 B2 | 9/2004 | Chen et al. |
| 6,790,757 B1 | 9/2004 | Chittipeddi et al. |
| 6,800,941 B2 | 10/2004 | Lee et al. |
| 6,812,575 B2 | 11/2004 | Furusawa |
| 6,815,257 B2 | 11/2004 | Yoon et al. |
| 6,825,552 B2 | 11/2004 | Light et al. |
| 6,828,665 B2 | 12/2004 | Pu et al. |
| 6,828,668 B2 | 12/2004 | Smith et al. |
| 6,844,619 B2 | 1/2005 | Tago |
| 6,856,235 B2 | 2/2005 | Fjelstad |
| 6,864,166 B1 | 3/2005 | Yin et al. |
| 6,867,499 B1 | 3/2005 | Tabrizi |
| 6,874,910 B2 | 4/2005 | Sugimoto et al. |
| 6,897,565 B2 | 5/2005 | Pflughaupt et al. |
| 6,900,530 B1 | 5/2005 | Tsai |
| 6,902,869 B2 | 6/2005 | Appelt et al. |
| 6,902,950 B2 | 6/2005 | Ma et al. |
| 6,906,408 B2 | 6/2005 | Cloud et al. |
| 6,908,785 B2 | 6/2005 | Kim |
| 6,909,181 B2 | 6/2005 | Aiba et al. |
| 6,917,098 B1 | 7/2005 | Yamunan |
| 6,930,256 B1 | 8/2005 | Huemoeller et al. |
| 6,933,598 B2 | 8/2005 | Kamezos |
| 6,933,608 B2 | 8/2005 | Fujisawa |
| 6,939,723 B2 | 9/2005 | Corisis et al. |
| 6,946,380 B2 | 9/2005 | Takahashi |
| 6,951,773 B2 | 10/2005 | Ho et al. |
| 6,962,282 B2 | 11/2005 | Manansala |
| 6,962,864 B1 | 11/2005 | Jeng et al. |
| 6,977,440 B2 | 12/2005 | Pflughaupt et al. |
| 6,979,599 B2 | 12/2005 | Silverbrook |
| 6,987,032 B1 | 1/2006 | Fan et al. |
| 6,989,122 B1 | 1/2006 | Pham et al. |
| 7,009,297 B1 | 3/2006 | Chiang et al. |
| 7,017,794 B2 | 3/2006 | Nosaka |
| 7,021,521 B2 | 4/2006 | Sakurai et al. |
| 7,045,884 B2 | 5/2006 | Standing |
| 7,051,915 B2 | 5/2006 | Mutaguchi |
| 7,052,935 B2 | 5/2006 | Pai et al. |
| 7,053,477 B2 | 5/2006 | Kamezos et al. |
| 7,053,485 B2 | 5/2006 | Bang et al. |
| 7,061,079 B2 | 6/2006 | Weng et al. |
| 7,061,097 B2 | 6/2006 | Yokoi |
| 7,067,911 B1 | 6/2006 | Lin et al. |
| 7,071,028 B2 | 7/2006 | Koike et al. |
| 7,071,547 B2 | 7/2006 | Kang et al. |
| 7,071,573 B1 | 7/2006 | Lin |
| 7,078,788 B2 | 7/2006 | Vu et al. |
| 7,078,822 B2 | 7/2006 | Dias et al. |
| 7,095,105 B2 | 8/2006 | Cherukuri et al. |
| 7,112,520 B2 | 9/2006 | Lee et al. |
| 7,115,986 B2 | 10/2006 | Moon et al. |
| 7,119,427 B2 | 10/2006 | Kim |
| 7,121,891 B2 | 10/2006 | Cherian |
| 7,138,722 B2 | 11/2006 | Miyamoto et al. |
| 7,170,185 B1 | 1/2007 | Hogerton et al. |
| 7,176,043 B2 | 2/2007 | Haba et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,187,072 B2 | 3/2007 | Fukitomi et al. |
| 7,190,061 B2 | 3/2007 | Lee |
| 7,198,980 B2 | 4/2007 | Jiang et al. |
| 7,198,987 B1 | 4/2007 | Warren et al. |
| 7,205,670 B2 | 4/2007 | Oyama |
| 7,215,033 B2 | 5/2007 | Lee et al. |
| 7,216,794 B2 | 5/2007 | Lange et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,246,431 B2 | 7/2007 | Bang et al. |
| 7,256,069 B2 | 8/2007 | Akram et al. |
| 7,259,445 B2 | 8/2007 | Lau et al. |
| 7,262,124 B2 | 8/2007 | Fujisawa |
| 7,262,506 B2 | 8/2007 | Mess et al. |
| 7,268,421 B1 | 9/2007 | Lin |
| 7,276,799 B2 | 10/2007 | Lee et al. |
| 7,287,322 B2 | 10/2007 | Mahieu et al. |
| 7,290,448 B2 | 11/2007 | Shirasaka et al. |
| 7,294,920 B2 | 11/2007 | Chen et al. |
| 7,294,928 B2 | 11/2007 | Bang et al. |
| 7,298,033 B2 | 11/2007 | Yoo |
| 7,301,770 B2 | 11/2007 | Campbell et al. |
| 7,307,348 B2 | 12/2007 | Wood et al. |

(56) References Cited

U.S. PATENT DOCUMENTS

| | | |
|---|---|---|
| 7,321,164 B2 | 1/2008 | Hsu |
| 7,323,767 B2 | 1/2008 | James et al. |
| 7,327,038 B2 | 2/2008 | Kwon et al. |
| 7,342,803 B2 | 3/2008 | Inagaki et al. |
| 7,344,917 B2 | 3/2008 | Gautham |
| 7,345,361 B2 | 3/2008 | Malik et al. |
| 7,355,289 B2 | 4/2008 | Hess et al. |
| 7,365,416 B2 | 4/2008 | Kawabata et al. |
| 7,368,924 B2 | 5/2008 | Beaman et al. |
| 7,371,676 B2 | 5/2008 | Hembree |
| 7,372,151 B1 | 5/2008 | Fan et al. |
| 7,378,726 B2 | 5/2008 | Punzalan et al. |
| 7,390,700 B2 | 6/2008 | Gerber et al. |
| 7,391,105 B2 | 6/2008 | Yeom |
| 7,391,121 B2 | 6/2008 | Otremba |
| 7,416,107 B2 | 8/2008 | Chapman et al. |
| 7,425,758 B2 | 9/2008 | Corisis et al. |
| 7,453,157 B2 | 11/2008 | Haba et al. |
| 7,456,091 B2 | 11/2008 | Kuraya et al. |
| 7,456,495 B2 | 11/2008 | Pohl et al. |
| 7,462,936 B2 | 12/2008 | Haba et al. |
| 7,476,608 B2 | 1/2009 | Craig et al. |
| 7,476,962 B2 | 1/2009 | Kim |
| 7,485,562 B2 | 2/2009 | Chua et al. |
| 7,495,179 B2 | 2/2009 | Kubota et al. |
| 7,495,342 B2 | 2/2009 | Beaman et al. |
| 7,495,644 B2 | 2/2009 | Hirakata |
| 7,504,284 B2 | 3/2009 | Ye et al. |
| 7,504,716 B2 | 3/2009 | Abbott |
| 7,517,733 B2 | 4/2009 | Camacho et al. |
| 7,527,505 B2 | 5/2009 | Murata |
| 7,535,090 B2 | 5/2009 | Furuyama et al. |
| 7,537,962 B2 | 5/2009 | Jang et al. |
| 7,538,565 B1 | 5/2009 | Beaman et al. |
| 7,550,836 B2 | 6/2009 | Chou et al. |
| 7,564,116 B2 | 7/2009 | Ahn et al. |
| 7,576,415 B2 | 8/2009 | Cha et al. |
| 7,576,439 B2 | 8/2009 | Craig et al. |
| 7,578,422 B2 | 8/2009 | Lange et al. |
| 7,582,963 B2 | 9/2009 | Gerber et al. |
| 7,589,394 B2 | 9/2009 | Kawano |
| 7,592,638 B2 | 9/2009 | Kim |
| 7,595,548 B2 | 9/2009 | Shirasaka et al. |
| 7,605,479 B2 | 10/2009 | Mohammed |
| 7,621,436 B2 | 11/2009 | Mii et al. |
| 7,625,781 B2 | 12/2009 | Beer |
| 7,629,695 B2 | 12/2009 | Yoshimura et al. |
| 7,633,154 B2 | 12/2009 | Dai et al. |
| 7,633,765 B1 | 12/2009 | Scanlan et al. |
| 7,642,133 B2 | 1/2010 | Wu et al. |
| 7,646,102 B2 | 1/2010 | Boon |
| 7,659,612 B2 | 2/2010 | Hembree et al. |
| 7,659,617 B2 | 2/2010 | Kang et al. |
| 7,663,226 B2 | 2/2010 | Cho et al. |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,962 B2 | 3/2010 | Hembree |
| 7,683,460 B2 | 3/2010 | Heitzer et al. |
| 7,683,482 B2 | 3/2010 | Nishida et al. |
| 7,696,631 B2 | 4/2010 | Beaulieu et al. |
| 7,706,144 B2 | 4/2010 | Lynch |
| 7,709,968 B2 | 5/2010 | Damberg et al. |
| 7,719,122 B2 | 5/2010 | Tsao et al. |
| 7,723,839 B2 | 5/2010 | Yano et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,759,782 B2 | 7/2010 | Haba et al. |
| 7,777,238 B2 | 8/2010 | Nishida et al. |
| 7,777,328 B2 | 8/2010 | Enomoto |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,807,512 B2 | 10/2010 | Lee et al. |
| 7,808,093 B2 | 10/2010 | Kagaya et al. |
| 7,834,464 B2 | 11/2010 | Meyer et al. |
| 7,838,334 B2 | 11/2010 | Yu et al. |
| 7,842,541 B1 | 11/2010 | Rusli et al. |
| 7,850,087 B2 | 12/2010 | Hwang et al. |
| 7,851,259 B2 | 12/2010 | Kim |
| 7,855,462 B2 | 12/2010 | Boon et al. |
| 7,855,464 B2 | 12/2010 | Shikano |
| 7,857,190 B2 | 12/2010 | Takahashi et al. |
| 7,859,033 B2 | 12/2010 | Brady |
| 7,872,335 B2 | 1/2011 | Khan et al. |
| 7,880,290 B2 | 2/2011 | Park |
| 7,892,889 B2 | 2/2011 | Howard et al. |
| 7,898,083 B2 | 3/2011 | Castro |
| 7,901,989 B2 | 3/2011 | Haba et al. |
| 7,902,644 B2 | 3/2011 | Huang et al. |
| 7,902,652 B2 | 3/2011 | Seo et al. |
| 7,910,385 B2 | 3/2011 | Kweon et al. |
| 7,911,805 B2 | 3/2011 | Haba |
| 7,919,846 B2 | 4/2011 | Hembree |
| 7,919,871 B2 | 4/2011 | Moon et al. |
| 7,923,295 B2 | 4/2011 | Shim et al. |
| 7,923,304 B2 | 4/2011 | Choi et al. |
| 7,928,552 B1 | 4/2011 | Cho et al. |
| 7,932,170 B1 | 4/2011 | Huemoeller et al. |
| 7,934,313 B1 | 5/2011 | Lin et al. |
| 7,939,934 B2 | 5/2011 | Haba et al. |
| 7,944,034 B2 | 5/2011 | Gerber et al. |
| 7,956,456 B2 | 6/2011 | Gurrum et al. |
| 7,960,843 B2 | 6/2011 | Hedler et al. |
| 7,964,956 B1 | 6/2011 | Bet-Shliemoun |
| 7,967,062 B2 | 6/2011 | Campbell et al. |
| 7,974,099 B2 | 7/2011 | Grajcar |
| 7,977,597 B2 | 7/2011 | Roberts et al. |
| 7,990,711 B1 | 8/2011 | Andry et al. |
| 7,994,622 B2 | 8/2011 | Mohammed et al. |
| 8,004,074 B2 | 8/2011 | Mori et al. |
| 8,004,093 B2 | 8/2011 | Oh et al. |
| 8,008,121 B2 | 8/2011 | Choi et al. |
| 8,012,797 B2 | 9/2011 | Shen et al. |
| 8,017,437 B2 | 9/2011 | Yoo et al. |
| 8,017,452 B2 | 9/2011 | Ishihara et al. |
| 8,018,033 B2 * | 9/2011 | Moriya ............ H01L 23/29 257/659 |
| 8,018,065 B2 | 9/2011 | Lam |
| 8,020,290 B2 | 9/2011 | Sheats |
| 8,021,907 B2 | 9/2011 | Pagaila et al. |
| 8,035,213 B2 | 10/2011 | Lee et al. |
| 8,039,316 B2 | 10/2011 | Chi et al. |
| 8,039,960 B2 | 10/2011 | Lin |
| 8,039,970 B2 | 10/2011 | Yamamori et al. |
| 8,048,479 B2 | 11/2011 | Hedler et al. |
| 8,053,814 B2 | 11/2011 | Chen et al. |
| 8,053,879 B2 | 11/2011 | Lee et al. |
| 8,053,906 B2 | 11/2011 | Chang et al. |
| 8,058,101 B2 | 11/2011 | Haba et al. |
| 8,063,475 B2 | 11/2011 | Choi et al. |
| 8,071,424 B2 | 12/2011 | Kang et al. |
| 8,071,431 B2 | 12/2011 | Hoang et al. |
| 8,071,470 B2 | 12/2011 | Khor et al. |
| 8,076,765 B2 | 12/2011 | Chen et al. |
| 8,076,770 B2 | 12/2011 | Kagaya et al. |
| 8,080,445 B1 | 12/2011 | Pagaila |
| 8,084,867 B2 | 12/2011 | Tang et al. |
| 8,092,734 B2 | 1/2012 | Jiang et al. |
| 8,093,697 B2 | 1/2012 | Haba et al. |
| 8,106,498 B2 | 1/2012 | Shin et al. |
| 8,115,283 B1 | 2/2012 | Bolognia et al. |
| 8,119,516 B2 | 2/2012 | Endo |
| 8,120,054 B2 | 2/2012 | Seo et al. |
| 8,120,186 B2 | 2/2012 | Yoon |
| 8,138,584 B2 | 3/2012 | Wang et al. |
| 8,143,141 B2 | 3/2012 | Sun et al. |
| 8,143,710 B2 | 3/2012 | Cho |
| 8,158,888 B2 | 4/2012 | Shen et al. |
| 8,169,065 B2 | 5/2012 | Kohl et al. |

(56) References Cited

U.S. PATENT DOCUMENTS

| | | | |
|---|---|---|---|
| 8,183,682 B2 | 5/2012 | Groenhuis et al. |
| 8,183,684 B2 | 5/2012 | Nakazato |
| 8,193,034 B2 | 6/2012 | Pagaila et al. |
| 8,194,411 B2 | 6/2012 | Leung et al. |
| 8,198,716 B2 | 6/2012 | Periaman et al. |
| 8,207,604 B2 | 6/2012 | Haba et al. |
| 8,213,184 B2 | 7/2012 | Knickerbocker |
| 8,217,502 B2 | 7/2012 | Ko |
| 8,225,982 B2 | 7/2012 | Pirkle et al. |
| 8,232,141 B2 | 7/2012 | Choi et al. |
| 8,237,257 B2 | 8/2012 | Yang |
| 8,258,010 B2 | 9/2012 | Pagaila et al. |
| 8,258,015 B2 | 9/2012 | Chow et al. |
| 8,263,435 B2 | 9/2012 | Choi et al. |
| 8,264,091 B2 | 9/2012 | Cho et al. |
| 8,269,335 B2 | 9/2012 | Osumi |
| 8,278,746 B2 | 10/2012 | Ding et al. |
| 8,288,854 B2 | 10/2012 | Weng et al. |
| 8,293,580 B2 | 10/2012 | Kim et al. |
| 8,299,368 B2 | 10/2012 | Endo |
| 8,304,900 B2 | 11/2012 | Jang et al. |
| 8,314,492 B2 | 11/2012 | Egawa |
| 8,315,060 B2 | 11/2012 | Morikita et al. |
| 8,318,539 B2 | 11/2012 | Cho et al. |
| 8,319,338 B1 | 11/2012 | Berry et al. |
| 8,324,633 B2 | 12/2012 | McKenzie et al. |
| 8,330,272 B2 | 12/2012 | Haba |
| 8,349,735 B2 | 1/2013 | Pagaila et al. |
| 8,354,297 B2 | 1/2013 | Pagaila et al. |
| 8,362,620 B2 | 1/2013 | Pagani |
| 8,372,741 B1 | 2/2013 | Co et al. |
| 8,390,108 B2 | 3/2013 | Cho et al. |
| 8,390,117 B2 | 3/2013 | Shimizu et al. |
| 8,395,259 B2 | 3/2013 | Eun |
| 8,399,972 B2 | 3/2013 | Hoang et al. |
| 8,404,520 B1* | 3/2013 | Chau ............... H01L 23/49517 228/155 |
| 8,409,922 B2 | 4/2013 | Camacho et al. |
| 8,415,704 B2 | 4/2013 | Ivanov et al. |
| 8,419,442 B2 | 4/2013 | Horikawa et al. |
| 8,435,899 B2 | 5/2013 | Miyata et al. |
| 8,450,839 B2 | 5/2013 | Corisis et al. |
| 8,476,115 B2 | 7/2013 | Choi et al. |
| 8,476,770 B2 | 7/2013 | Shao et al. |
| 8,482,111 B2 | 7/2013 | Haba |
| 8,487,421 B2 | 7/2013 | Sato et al. |
| 8,492,201 B2 | 7/2013 | Pagaila et al. |
| 8,502,387 B2 | 8/2013 | Choi et al. |
| 8,507,297 B2 | 8/2013 | Iida et al. |
| 8,508,045 B2 | 8/2013 | Khan et al. |
| 8,518,746 B2 | 8/2013 | Pagaila et al. |
| 8,520,396 B2 | 8/2013 | Schmidt et al. |
| 8,525,214 B2 | 9/2013 | Lin et al. |
| 8,525,314 B2 | 9/2013 | Haba et al. |
| 8,525,318 B1 | 9/2013 | Kim et al. |
| 8,552,556 B1 | 10/2013 | Kim et al. |
| 8,558,379 B2 | 10/2013 | Kwon |
| 8,558,392 B2 | 10/2013 | Chua et al. |
| 8,564,141 B2 | 10/2013 | Lee et al. |
| 8,567,051 B2 | 10/2013 | Val |
| 8,569,892 B2 | 10/2013 | Mori et al. |
| 8,580,607 B2 | 11/2013 | Haba |
| 8,598,717 B2 | 12/2013 | Masuda |
| 8,618,646 B2 | 12/2013 | Sasaki et al. |
| 8,618,659 B2 | 12/2013 | Sato et al. |
| 8,624,374 B2 | 1/2014 | Ding et al. |
| 8,637,991 B2 | 1/2014 | Haba |
| 8,642,393 B1 | 2/2014 | Yu et al. |
| 8,646,508 B2 | 2/2014 | Kawada |
| 8,653,626 B2 | 2/2014 | Lo et al. |
| 8,653,668 B2 | 2/2014 | Uno et al. |
| 8,653,676 B2 | 2/2014 | Kim et al. |
| 8,659,164 B2 | 2/2014 | Haba |
| 8,664,780 B2 | 3/2014 | Han et al. |
| 8,669,646 B2 | 3/2014 | Tabatabai et al. |
| 8,670,261 B2 | 3/2014 | Crisp et al. |
| 8,680,662 B2 | 3/2014 | Haba et al. |
| 8,680,677 B2 | 3/2014 | Wyland |
| 8,680,684 B2 | 3/2014 | Haba et al. |
| 8,685,792 B2 | 4/2014 | Chow et al. |
| 8,697,492 B2 | 4/2014 | Haba et al. |
| 8,723,307 B2 | 5/2014 | Jiang et al. |
| 8,728,865 B2 | 5/2014 | Haba et al. |
| 8,729,714 B1 | 5/2014 | Meyer |
| 8,742,576 B2 | 6/2014 | Thacker et al. |
| 8,742,597 B2 | 6/2014 | Nickerson |
| 8,766,436 B2 | 7/2014 | Delucca et al. |
| 8,772,152 B2 | 7/2014 | Co et al. |
| 8,772,817 B2 | 7/2014 | Yao |
| 8,785,245 B2 | 7/2014 | Kim |
| 8,791,575 B2 | 7/2014 | Oganesian et al. |
| 8,791,580 B2 | 7/2014 | Park et al. |
| 8,796,846 B2 | 8/2014 | Lin et al. |
| 8,802,494 B2 | 8/2014 | Lee et al. |
| 8,810,031 B2 | 8/2014 | Chang et al. |
| 8,811,055 B2 | 8/2014 | Yoon |
| 8,816,404 B2 | 8/2014 | Kim et al. |
| 8,835,228 B2 | 9/2014 | Mohammed |
| 8,836,136 B2 | 9/2014 | Chau et al. |
| 8,836,140 B2 | 9/2014 | Ma et al. |
| 8,836,147 B2 | 9/2014 | Uno et al. |
| 8,841,765 B2 | 9/2014 | Haba et al. |
| 8,846,521 B2 | 9/2014 | Sugizaki |
| 8,847,376 B2 | 9/2014 | Oganesian et al. |
| 8,853,558 B2 | 10/2014 | Gupta et al. |
| 8,878,353 B2 | 11/2014 | Haba et al. |
| 8,884,416 B2 | 11/2014 | Lee et al. |
| 8,893,380 B2 | 11/2014 | Kim et al. |
| 8,907,466 B2 | 12/2014 | Haba |
| 8,907,500 B2 | 12/2014 | Haba et al. |
| 8,912,651 B2 | 12/2014 | Yu et al. |
| 8,916,781 B2 | 12/2014 | Haba et al. |
| 8,922,005 B2 | 12/2014 | Hu et al. |
| 8,923,004 B2 | 12/2014 | Low et al. |
| 8,927,337 B2 | 1/2015 | Haba et al. |
| 8,937,309 B2 | 1/2015 | England et al. |
| 8,940,630 B2 | 1/2015 | Damberg et al. |
| 8,940,636 B2 | 1/2015 | Pagaila et al. |
| 8,946,757 B2 | 2/2015 | Mohammed et al. |
| 8,963,339 B2 | 2/2015 | He et al. |
| 8,970,049 B2 | 3/2015 | Karnezos |
| 8,975,726 B2 | 3/2015 | Chen |
| 8,978,247 B2 | 3/2015 | Yang et al. |
| 8,981,559 B2 | 3/2015 | Hsu et al. |
| 8,987,132 B2 | 3/2015 | Gruber et al. |
| 8,988,895 B2 | 3/2015 | Mohammed et al. |
| 8,993,376 B2 | 3/2015 | Camacho et al. |
| 9,006,031 B2 | 4/2015 | Camacho et al. |
| 9,012,263 B1 | 4/2015 | Mathew et al. |
| 9,041,227 B2 | 5/2015 | Chau et al. |
| 9,054,095 B2 | 6/2015 | Pagaila |
| 9,082,763 B2 | 7/2015 | Yu et al. |
| 9,093,435 B2 | 7/2015 | Sato et al. |
| 9,095,074 B2 | 7/2015 | Haba et al. |
| 9,105,483 B2 | 8/2015 | Chau et al. |
| 9,105,552 B2 | 8/2015 | Yu et al. |
| 9,117,811 B2 | 8/2015 | Zohni |
| 9,123,664 B2 | 9/2015 | Haba |
| 9,136,254 B2 | 9/2015 | Zhao et al. |
| 9,142,586 B2 | 9/2015 | Wang et al. |
| 9,153,562 B2 | 10/2015 | Haba et al. |
| 9,171,790 B2 | 10/2015 | Yu et al. |
| 9,177,832 B2 | 11/2015 | Camacho |
| 9,196,586 B2 | 11/2015 | Chen et al. |
| 9,196,588 B2 | 11/2015 | Leal |
| 9,214,434 B1 | 12/2015 | Kim et al. |
| 9,224,647 B2 | 12/2015 | Koo et al. |
| 9,224,717 B2 | 12/2015 | Sato et al. |
| 9,258,922 B2 | 2/2016 | Chen et al. |
| 9,263,394 B2 | 2/2016 | Uzoh et al. |
| 9,263,413 B2 | 2/2016 | Mohammed |
| 9,299,670 B2 | 3/2016 | Yap et al. |
| 9,318,452 B2 | 4/2016 | Chen et al. |
| 9,324,696 B2 | 4/2016 | Choi et al. |

(56) References Cited

U.S. PATENT DOCUMENTS

| | | |
|---|---|---|
| 9,349,706 B2 | 5/2016 | Co et al. |
| 9,362,161 B2 | 6/2016 | Chi et al. |
| 9,379,074 B2 | 6/2016 | Uzoh et al. |
| 9,379,078 B2 | 6/2016 | Yu et al. |
| 9,401,338 B2 | 7/2016 | Magnus et al. |
| 9,412,661 B2 | 8/2016 | Lu et al. |
| 9,418,940 B2 | 8/2016 | Hoshino et al. |
| 9,418,971 B2 | 8/2016 | Chen et al. |
| 9,437,459 B2 | 9/2016 | Carpenter et al. |
| 9,443,797 B2 | 9/2016 | Marimuthu et al. |
| 9,449,941 B2 | 9/2016 | Tsai et al. |
| 9,461,025 B2 | 10/2016 | Yu et al. |
| 9,496,152 B2 | 11/2016 | Cho et al. |
| 9,502,390 B2 | 11/2016 | Caskey et al. |
| 9,508,622 B2 | 11/2016 | Higgins |
| 9,559,088 B2 | 1/2017 | Gonzalez et al. |
| 9,570,382 B2 | 2/2017 | Haba |
| 9,583,456 B2 | 2/2017 | Uzoh et al. |
| 9,601,454 B2 | 3/2017 | Zhao et al. |
| 9,735,084 B2 | 8/2017 | Katkar et al. |
| 2001/0042925 A1 | 11/2001 | Yamamoto et al. |
| 2002/0014004 A1 | 2/2002 | Beaman et al. |
| 2002/0125556 A1 | 9/2002 | Oh et al. |
| 2002/0171152 A1 | 11/2002 | Miyazaki |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0094666 A1 | 5/2003 | Clayton et al. |
| 2003/0162378 A1 | 8/2003 | Mikami |
| 2004/0041757 A1 | 3/2004 | Yang et al. |
| 2004/0262728 A1 | 12/2004 | Sterrett et al. |
| 2005/0017369 A1 | 1/2005 | Clayton et al. |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0173807 A1 | 8/2005 | Zhu et al. |
| 2005/0176233 A1 | 8/2005 | Joshi et al. |
| 2006/0087013 A1 | 4/2006 | Hsieh |
| 2006/0255449 A1 | 11/2006 | Lee et al. |
| 2007/0010086 A1 | 1/2007 | Hsieh |
| 2007/0080360 A1 | 4/2007 | Mirsky et al. |
| 2007/0190747 A1 | 8/2007 | Hup |
| 2007/0254406 A1 | 11/2007 | Lee |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |
| 2008/0023805 A1 | 1/2008 | Howard et al. |
| 2008/0042265 A1 | 2/2008 | Merilo et al. |
| 2008/0047741 A1 | 2/2008 | Beaman et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0105984 A1 | 5/2008 | Lee et al. |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0169548 A1 | 7/2008 | Baek |
| 2008/0217708 A1 | 9/2008 | Reisner et al. |
| 2008/0280393 A1 | 11/2008 | Lee et al. |
| 2008/0284045 A1 | 11/2008 | Gerber et al. |
| 2008/0303153 A1 | 12/2008 | Oi et al. |
| 2008/0308305 A1 | 12/2008 | Kawabe |
| 2009/0008796 A1 | 1/2009 | Eng et al. |
| 2009/0014876 A1 | 1/2009 | Youn et al. |
| 2009/0032913 A1 | 2/2009 | Haba |
| 2009/0085185 A1 | 4/2009 | Byun et al. |
| 2009/0091009 A1 | 4/2009 | Corisis et al. |
| 2009/0102063 A1 | 4/2009 | Lee et al. |
| 2009/0127686 A1 | 5/2009 | Yang et al. |
| 2009/0128176 A1 | 5/2009 | Beaman et al. |
| 2009/0140415 A1 | 6/2009 | Furuta |
| 2009/0166664 A1 | 7/2009 | Park et al. |
| 2009/0166873 A1 | 7/2009 | Yang et al. |
| 2009/0189288 A1 | 7/2009 | Beaman et al. |
| 2009/0194829 A1 | 8/2009 | Chung et al. |
| 2009/0256229 A1 | 10/2009 | Ishikawa et al. |
| 2009/0315579 A1 | 12/2009 | Beaman et al. |
| 2010/0032822 A1 | 2/2010 | Liao et al. |
| 2010/0044860 A1 | 2/2010 | Haba et al. |
| 2010/0078795 A1 | 4/2010 | Dekker et al. |
| 2010/0193937 A1 | 8/2010 | Nagamatsu et al. |
| 2010/0200981 A1 | 8/2010 | Huang et al. |
| 2010/0258955 A1 | 10/2010 | Miyagawa et al. |
| 2010/0289142 A1 | 11/2010 | Shim et al. |
| 2010/0314748 A1 | 12/2010 | Hsu et al. |
| 2010/0327419 A1 | 12/2010 | Muthukumar et al. |
| 2011/0042699 A1 | 2/2011 | Park et al. |
| 2011/0068478 A1 | 3/2011 | Pagaila et al. |
| 2011/0084368 A1* | 4/2011 | Hoang ............... H01L 23/552 257/660 |
| 2011/0157834 A1 | 6/2011 | Wang |
| 2011/0209908 A1 | 9/2011 | Lin et al. |
| 2011/0215472 A1 | 9/2011 | Chandrasekaran |
| 2012/0001336 A1 | 1/2012 | Zeng et al. |
| 2012/0043655 A1 | 2/2012 | Khor et al. |
| 2012/0063090 A1 | 3/2012 | Hsiao et al. |
| 2012/0080787 A1 | 4/2012 | Shah et al. |
| 2012/0086111 A1 | 4/2012 | Iwamoto et al. |
| 2012/0126431 A1 | 5/2012 | Kim et al. |
| 2012/0153444 A1 | 6/2012 | Haga et al. |
| 2012/0184116 A1 | 7/2012 | Pawlikowski et al. |
| 2013/0001797 A1 | 1/2013 | Choi et al. |
| 2013/0049218 A1 | 2/2013 | Gong et al. |
| 2013/0087915 A1 | 4/2013 | Warren et al. |
| 2013/0153646 A1 | 6/2013 | Ho |
| 2013/0200524 A1 | 8/2013 | Han et al. |
| 2013/0234317 A1 | 9/2013 | Chen et al. |
| 2013/0256847 A1 | 10/2013 | Park et al. |
| 2013/0323409 A1 | 12/2013 | Read et al. |
| 2013/0324069 A1* | 12/2013 | Chen ..................... H04B 1/44 455/334 |
| 2013/0328178 A1 | 12/2013 | Bakalski et al. |
| 2014/0035892 A1 | 2/2014 | Shenoy et al. |
| 2014/0103527 A1 | 4/2014 | Marimuthu et al. |
| 2014/0124949 A1 | 5/2014 | Paek et al. |
| 2014/0175657 A1 | 6/2014 | Oka et al. |
| 2014/0225248 A1 | 8/2014 | Henderson et al. |
| 2014/0239479 A1 | 8/2014 | Start |
| 2014/0239490 A1 | 8/2014 | Wang |

(56) References Cited

U.S. PATENT DOCUMENTS

| | | |
|---|---|---|
| 2014/0308907 A1 | 10/2014 | Chen |
| 2014/0312503 A1 | 10/2014 | Sec |
| 2015/0044823 A1 | 2/2015 | Mohammed |
| 2015/0076714 A1 | 3/2015 | Haba et al. |
| 2015/0130054 A1 | 5/2015 | Lee et al. |
| 2015/0206865 A1 | 7/2015 | Yu et al. |
| 2015/0340305 A1 | 11/2015 | Lo |
| 2015/0380376 A1 | 12/2015 | Mathew et al. |
| 2016/0043813 A1 | 2/2016 | Chen et al. |
| 2016/0200566 A1 | 7/2016 | Ofner et al. |
| 2016/0225692 A1 | 8/2016 | Kim et al. |
| 2017/0117231 A1* | 4/2017 | Awujoola ............ H01L 23/552 |

FOREIGN PATENT DOCUMENTS

| | | |
|---|---|---|
| CN | 1877824 A | 12/2006 |
| CN | 101409241 A | 4/2009 |
| CN | 101449375 A | 6/2009 |
| CN | 101675516 A | 3/2010 |
| CN | 101819959 A | 9/2010 |
| CN | 102324418 A | 1/2012 |
| EP | 920058 | 6/1999 |
| EP | 1449414 A1 | 8/2004 |
| EP | 2234158 A1 | 9/2010 |
| JP | S51-050661 | 5/1976 |
| JP | 59189069 A | 10/1984 |
| JP | 61125062 A | 6/1986 |
| JP | S62158338 A | 7/1987 |
| JP | 32-226307 | 10/1987 |
| JP | 1012769 A | 1/1989 |
| JP | 64-71162 | 3/1989 |
| JP | 1118364 | 5/1989 |
| JP | H04-346436 | 12/1992 |
| JP | 06268015 A | 9/1994 |
| JP | H06333931 A | 12/1994 |
| JP | 07-122787 A | 5/1995 |
| JP | H1065054 A | 3/1998 |
| JP | H10135220 A | 5/1998 |
| JP | H10135221 A | 5/1998 |
| JP | 11-074295 A | 3/1999 |
| JP | 11135663 A | 5/1999 |
| JP | H11-145323 A | 5/1999 |
| JP | 11251350 A | 9/1999 |
| JP | H11260856 A | 9/1999 |
| JP | 11317476 | 11/1999 |
| JP | 2000323516 A | 11/2000 |
| JP | 2001196407 A | 7/2001 |
| JP | 2001326236 A | 11/2001 |
| JP | 2002289769 A | 10/2002 |
| JP | 2003122611 A | 4/2003 |
| JP | 2003-174124 A | 6/2003 |
| JP | 2003307897 A | 10/2003 |
| JP | 2004031754 A | 1/2004 |
| JP | 2004-172157 A | 6/2004 |
| JP | 2004-200316 | 7/2004 |
| JP | 2004281514 A | 10/2004 |
| JP | 2004-319892 A | 11/2004 |
| JP | 2004327855 A | 11/2004 |
| JP | 2004327856 A | 11/2004 |
| JP | 2004343030 A | 12/2004 |
| JP | 2005011874 A | 1/2005 |
| JP | 2005033141 A | 2/2005 |
| JP | 2005142378 A | 6/2005 |
| JP | 2005175019 A | 6/2005 |
| JP | 2005183880 A | 7/2005 |
| JP | 2005183923 A | 7/2005 |
| JP | 2005203497 A | 7/2005 |
| JP | 2005302765 A | 10/2005 |
| JP | 2006108588 A | 4/2006 |
| JP | 2006186086 A | 7/2006 |
| JP | 2007123595 A | 5/2007 |
| JP | 2007-208159 A | 8/2007 |
| JP | 2007234845 A | 9/2007 |
| JP | 2007287922 A | 11/2007 |
| JP | 2007-335464 A | 12/2007 |
| JP | 200834534 A | 2/2008 |
| JP | 2008166439 A | 7/2008 |
| JP | 2008171938 A | 7/2008 |
| JP | 2008251794 A | 10/2008 |
| JP | 2008277362 A | 11/2008 |
| JP | 2008306128 A | 12/2008 |
| JP | 2009004650 A | 1/2009 |
| JP | 2009044110 A | 2/2009 |
| JP | 2009506553 A | 2/2009 |
| JP | 2009508324 A | 2/2009 |
| JP | 2009064966 A | 3/2009 |
| JP | 2009088254 A | 4/2009 |
| JP | 2009111384 A | 5/2009 |
| JP | 2009528706 A | 8/2009 |
| JP | 2009260132 A | 11/2009 |
| JP | 2010103129 A | 5/2010 |
| JP | 2010192928 A | 9/2010 |
| JP | 2010199528 A | 9/2010 |
| JP | 2010206007 A | 9/2010 |
| JP | 2011514015 A | 4/2011 |
| KR | 100265563 A1 | 9/2000 |
| KR | 20010061849 A | 7/2001 |
| KR | 2001-0094894 A | 11/2001 |
| KR | 20020058216 A | 7/2002 |
| KR | 20060064291 A | 6/2006 |
| KR | 20080020069 | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 20100062315 A | 6/2010 |
| KR | 101011863 B1 | 1/2011 |
| KR | 20120075855 A | 7/2012 |
| KR | 20150012285 A | 2/2015 |
| TW | 200539406 A | 12/2005 |
| TW | 200810079 | 2/2008 |
| TW | 200849551 A | 12/2008 |
| TW | 200933760 A | 8/2009 |
| TW | 201023277 A | 6/2010 |
| TW | 201250979 A | 12/2012 |
| WO | 02-13256 A1 | 2/2002 |
| WO | 03-045123 A1 | 5/2003 |
| WO | 2004077525 A2 | 9/2004 |
| WO | 2006050691 A2 | 5/2006 |
| WO | 2007101251 A2 | 9/2007 |
| WO | 2008065896 A1 | 6/2008 |
| WO | 2008120755 A1 | 10/2008 |
| WO | 2009096950 A1 | 8/2009 |
| WO | 2009158098 A2 | 12/2009 |
| WO | 2010041630 A1 | 4/2010 |
| WO | 2010101163 A1 | 9/2010 |
| WO | 2012067177 A1 | 5/2012 |
| WO | 2013059181 A1 | 4/2013 |
| WO | 2013065895 A1 | 5/2013 |
| WO | 2014107301 A1 | 7/2014 |

OTHER PUBLICATIONS

3D Plus "Wafer Level Stack—WDoD", [online] [Retrieved Aug. 5, 2010] Retrieved from internet: <http://www.3d-plus.com/techno-wafer-level-stack-wdod.php>, 2 pages.
Written Opinion for Appln. No. PCT/US2014/050125, dated Jul. 15, 2015.
Yoon, PhD, Seung Wook, "Next Generation Wafer Level Packaging Solution for 3D Integration," May 2010, STATS ChipPAC Ltd.
Brochure, "High Performance BVA PoP Package for Mobile Systems," Invensas Corporation, May 2013, 20 pages.
Brochure, "Invensas BVA PoP for Mobile Computing: Ultra High IO Without TSVs," Invensas Corporation, Jun. 26, 2012, 4 pages.
Brochure, "Invensas BVA PoP for Mobile Computing: 100+ GB/s BVA PoP," Invensas Corporation, c. 2012, 2 pages.
Campos et al., "System in Package Solutions Using Fan-Out Wafer Level Packaging Technology," SEMI Networking Day, Jun. 27, 2013, 31 pages.
Chinese Office Action for Application No. 201180022247.8 dated Sep. 16, 2014.

(56) References Cited

OTHER PUBLICATIONS

Chinese Office Action for Application No. 201180022247.8 dated Apr. 14, 2015.
Chinese Office Action for Application No. 201310264264.3 dated May 12, 2015.
EE Times Asia "Freescale Cuts Die Area, Thickness with New Packaging Tech" [online] [Retrieved Aug. 5, 2010] Retrieved from internet: <http://www.eetasia.com/ART_8800428222_280300_NT_DEC52276.htm>, Aug. 3, 2006, 2 pages.
Extended European Search Report for Appln. No. EP13162975, dated Sep. 5, 2013.
IBM et al., "Method of Producing Thin-Film Wirings with Vias," IBM Technical Disclosure Bulletin, Apr. 1, 1989, IBM Corp., (Thornwood), US-ISSN 0018-8689, vol. 31, No. 11, pp. 209-210, https://priorart.ip.com.
International Search Report for Appln. No. PCT/US2005/039716, dated Apr. 5, 2006.
International Search Report and Written Opinion for Appln. No. PCT/US2011/024143, dated Sep. 14, 2011.
Partial Search Report—Invitation to Pay Fees for Appln. No. PCT/US2011/024143, dated Jan. 17, 2012.
International Search Report and Written Opinion for Appln. No. PCT/US2011/060551, dated Apr. 18, 2012.
International Search Report and Written Opinion for Appln. No. PCT/US2011/044342, dated May 7, 2012.
International Search Report and Written Opinion for Appln. No. PCT/US2011/044346, dated May 11, 2012.
International Search Report and Written Opinion for Appln. No. PCT/US2012/060402, dated Apr. 2, 2013.
International Search Report and Written Opinion for Appln. No. PCT/US2013/026126, dated Jul. 25, 2013.
International Search Report and Written Opinion for Appln. No. PCT/US2013/052883, dated Oct. 21, 2013.
International Search Report and Written Opinion for Appln. No. PCT/US2013/041981, dated Nov. 13, 2013.
International Search Report and Written Opinion for Appln. No. PCT/US2013/053437, dated Nov. 25, 2013.
International Search Report and Written Opinion for Appln. No. PCT/US2013/075672, dated Apr. 22, 2014.
International Search Report and Written Opinion for Appln. No. PCT/US2014/014181, dated Jun. 13, 2014.
International Search Report and Written Opinion for Appln. No. PCT/US2014/050125, dated Feb. 4, 2015.
International Search Report and Written Opinion for Appln. No. PCT/US2014/050148, dated Feb. 9, 2015.
International Search Report and Written Opinion for Appln. No. PCT/US2014/055695, dated Mar. 20, 2015.
International Search Report and Written Opinion for Appln. No. PCT/US2015/011715, dated Apr. 20, 2015.
International Preliminary Report on Patentability for Appln. No. PCT/US2014/055695, dated Dec. 15, 2015.
International Search Report and Written Opinion for Appln. No. PCT/US2016/056402, dated Jan. 31, 2017.
Japanese Office Action for Appln. No. 2013-509325, dated Oct. 18, 2013.
Japanese Office Action for Appln. No. 2013-520776, dated Apr. 21, 2015.
Japanese Office Action for Appln. No. 2013-520777, dated May 22, 2015.
Jin, Yonggang et al., "STM 3D-IC Package and 3D eWLB Development," STMicroelectronics Singapore/ STMicroelectronics France, May 21, 2010, 28 pages.
Kim et al., "Application of Through Mold Via (TMV) as PoP Base Package," 2008, 6 pages.
Korean Office Action for Appn. 10-2011-0041843, dated Jun. 20, 2011.
Korean Office Action for Appn. 2014-7025992, dated Feb. 5, 2015.
Korean Search Report KR10-2010-0113271, dated Jan. 12, 2011.
Korean Search Report KR10-2011-0041843, dated Feb. 24, 2011.
Neo-Manhattan Technology, A Novel HDI Manufacturing Process, "High-Density Interconnects for Advanced Flex Substrates and 3-D Package Stacking," IPC Flex & Chips Symposium, Tempe, AZ, Feb. 11-12, 2003, 34 pages.
NTK HTCC Package General Design Guide, Communication Media Components Group, NGK Spark Plug Co., Ltd., Komaki, Aichi, Japan, Apr. 2010, 32 pages.
Partial International Search Report from Invitation to Pay Additional Fees for Appln. No. PCT/US2012/028738, dated Jun. 6, 2012.
Partial International Search Report for Appln. No. PCT/US2012/060402, dated Feb. 21, 2013.
Partial International Search Report for Appln. No. PCT/US2013/026126, dated Jun. 17, 2013.
Partial International Search Report for Appln. No. PCT/US2013/075672, dated Mar. 12, 2014.
Partial International Search Report for Appln. No. PCT/US2014/014181, dated May 8, 2014.
Partial International Search Report for Appln. No. PCT/US2015/033004, dated Sep. 9, 2015.
Redistributed Chip Package (RCP) Technology, Freescale Semiconductor, 2005, 6 pages.
Taiwan Office Action for 102106326, dated Dec. 13, 2013.
Taiwan Office Action for 100125521, dated Dec. 20, 2013.
Taiwan Office Action for 100125522, dated Jan. 27, 2014.
Taiwan Office Action for 100141695, dated Mar. 19, 2014.
Taiwan Office Action for 100138311, dated Jun. 27, 2014.
Taiwan Office Action for 100140428, dated Jan. 26, 2015.
Taiwan Office Action for 103103350, dated Mar. 21, 2016.
North Corporation, Processed Intra-Layer Interconnection Material for PWRs [Etched Copper Bump with Copper Foil], NMBITM, Version 2001.6.
Taiwan Office Action for 102106326, dated Sep. 8, 2015.

* cited by examiner

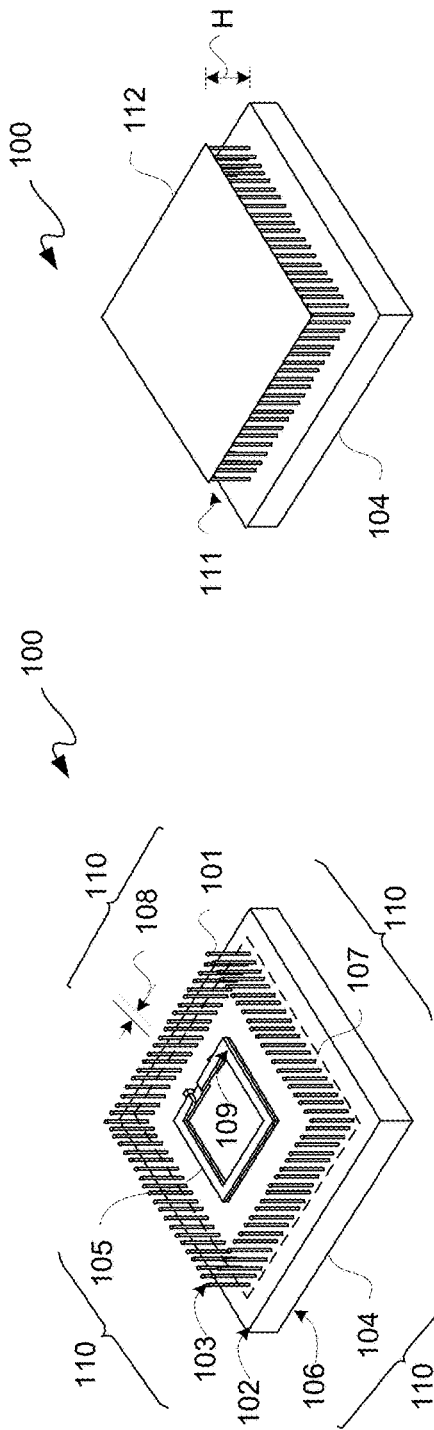
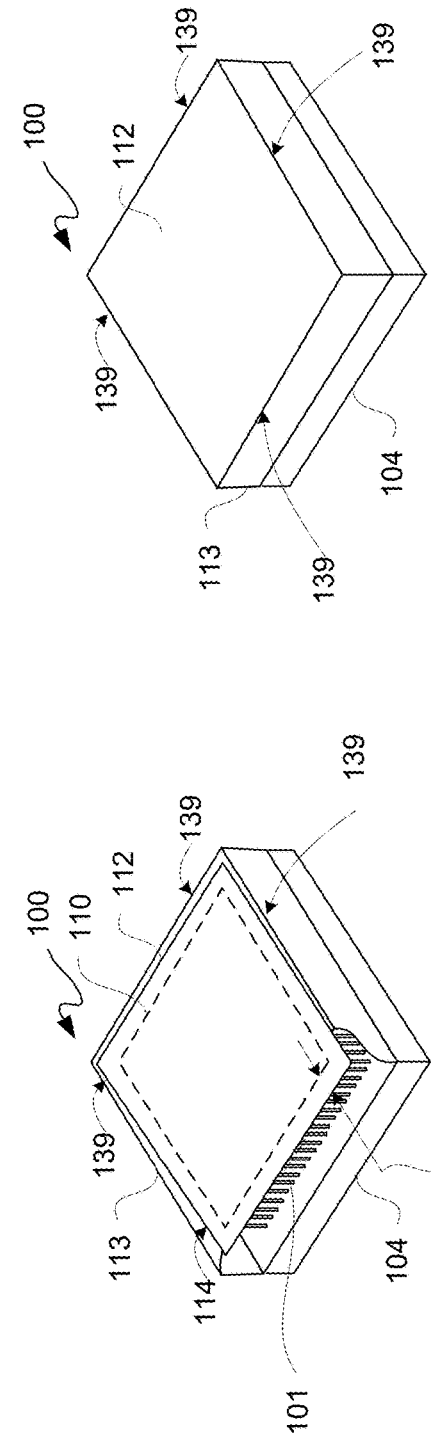

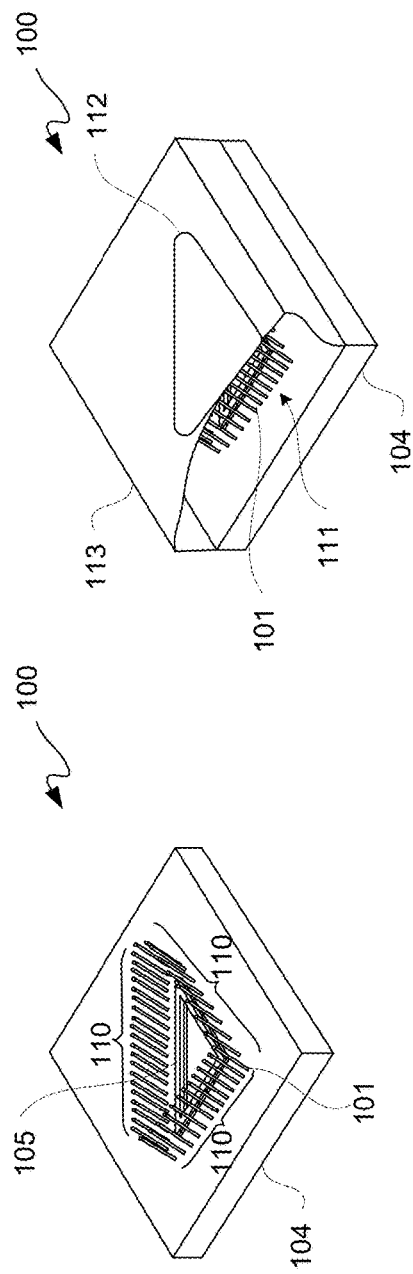
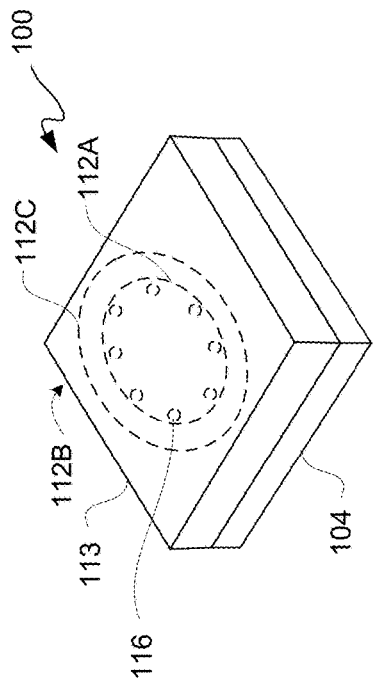
FIG. 4-1
FIG. 4-2
FIG. 5

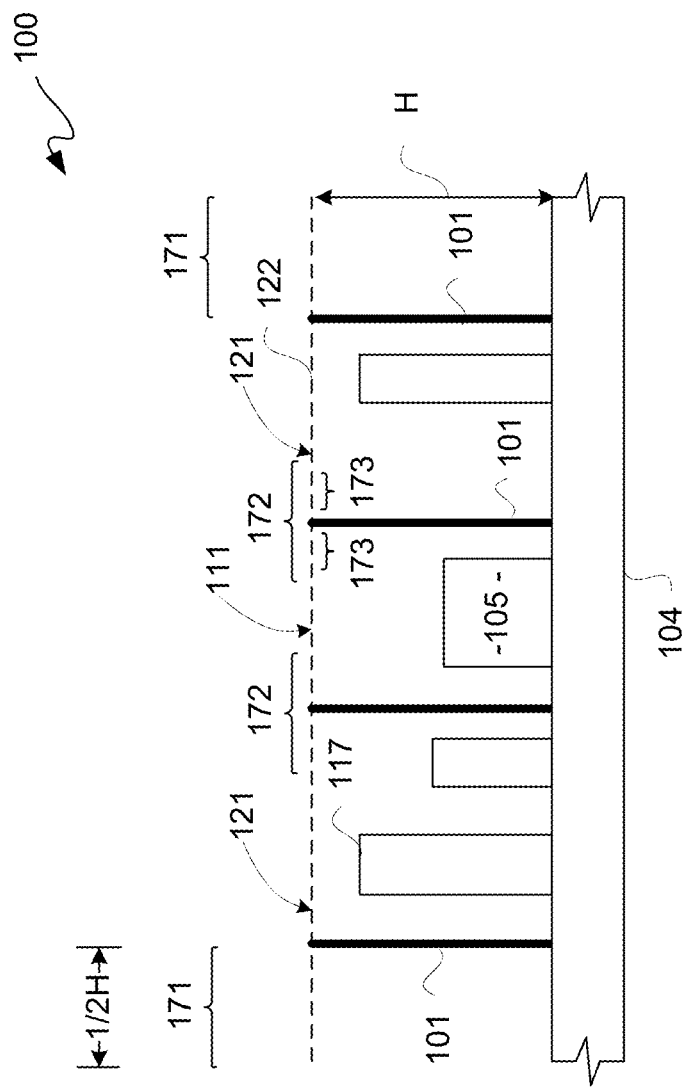

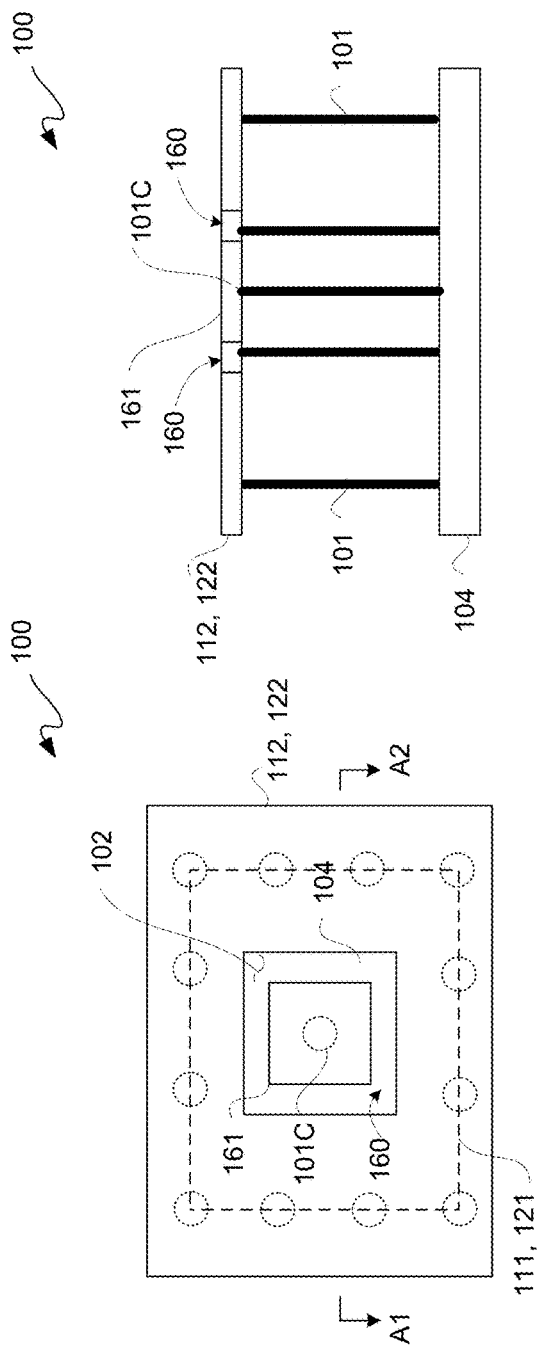
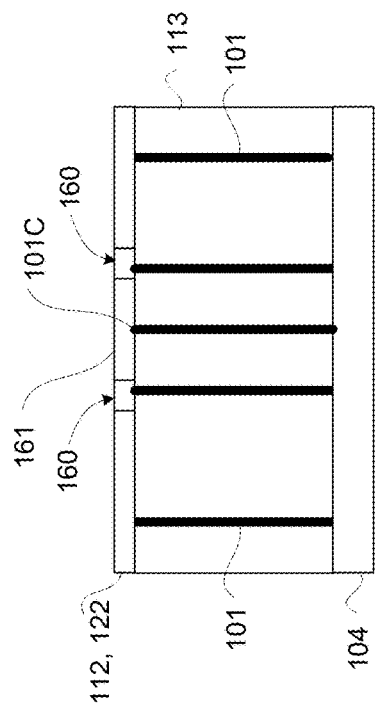
FIG. 11
FIG. 12-1
FIG. 12-2

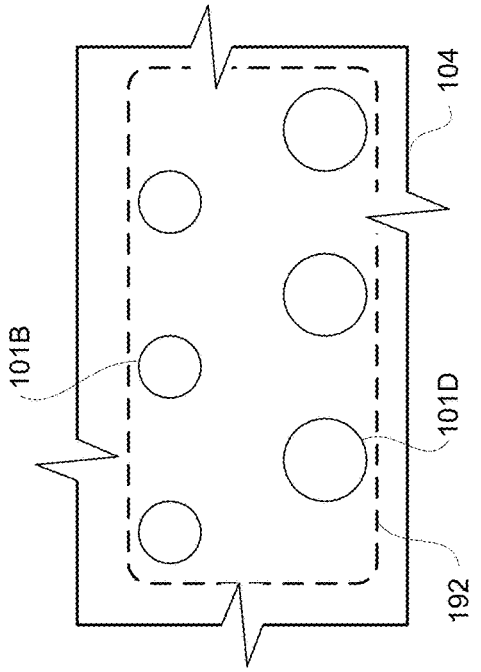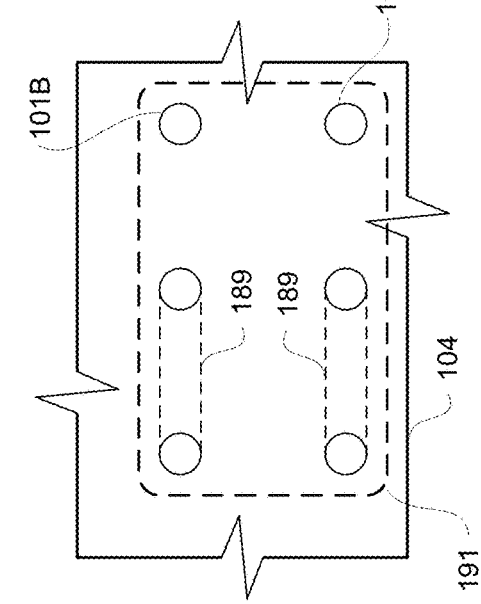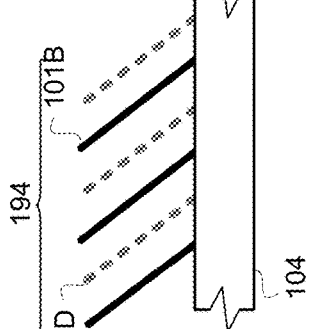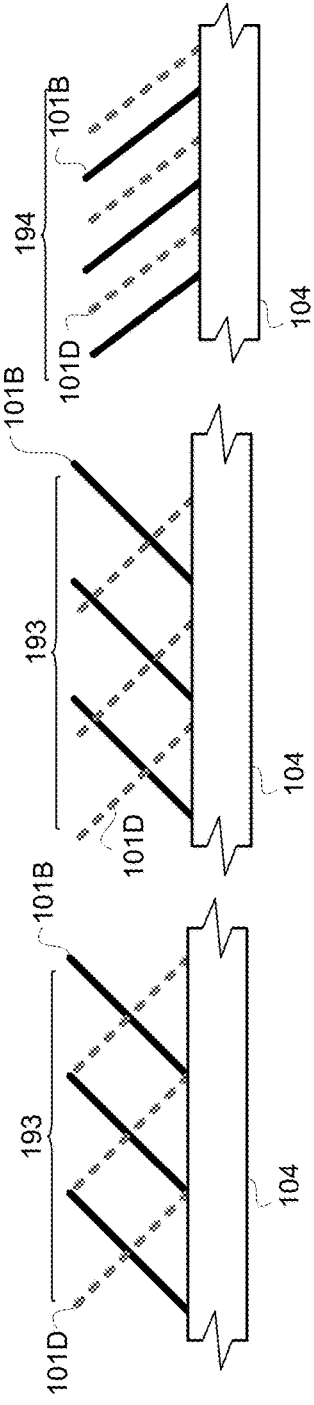

WIRE BONDING METHOD AND APPARATUS FOR ELECTROMAGNETIC INTERFERENCE SHIELDING

CROSS-REFERENCE TO RELATED APPLICATIONS

This application claims the benefit under 35 U.S.C. section 119(e) of U.S. Provisional Application No. 62/368,423, filed Jul. 29, 2016, the entirety of which is incorporated by reference herein for all purposes.

FIELD

The following description relates generally to integrated circuits ("ICs"). More particularly, the following description relates generally to wire bonding for electromagnetic interference shielding.

BACKGROUND

Some passive or active microelectronic devices may be shielded from electromagnetic interference ("EMI"), including without limitation radio frequency interference ("RFI"). However, conventional shielding may be complicated to fabricate, too heavy for some mobile applications, too expensive to produce and/or assemble, and/or too large for some low-profile applications. Moreover, some shielding may not be suitable for a stacked die or a stacked package, generally referred to as three-dimensional ("3D") ICs or "3D ICs."

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

FIG. 1-1 is a top-down perspective view illustratively depicting an exemplary microelectronic package having interference protection.

FIG. 1-2 is the top-down perspective view illustratively depicting the exemplary microelectronic package of FIG. 1-1 after the addition of a conductive layer.

FIG. 1-3 is a cut-away diagram of the top-down perspective view illustratively depicting the exemplary microelectronic package of FIG. 1-1 after the addition of a molding layer and a conductive layer.

FIG. 1-4 is a block diagram of the top-down perspective view illustratively depicting the exemplary microelectronic package of FIG. 1-1 after the addition of a molding layer and a conductive layer, where conductive layer covers an upper surface of the microelectronic package.

FIGS. 2-1 through 2-7 are respective block diagrams of side views illustratively depicting exemplary profiles of wire bond wires.

FIG. 3-1 is the exemplary microelectronic package of FIG. 1-3 though with slash-like shaped wire bond wires.

FIG. 3-2 is the exemplary microelectronic package of FIG. 1-3 though with squared-off vertical-z-like shaped wire bond wires.

FIG. 4-1 is a top-down perspective view illustratively depicting an exemplary microelectronic package having interference protection, as in FIG. 1-1, though with a triangularly shaped microelectronic device.

FIG. 4-2 is a cut-away diagram of the top-down perspective view illustratively depicting the exemplary microelectronic package of FIG. 4-1 after the addition of a molding layer and a triangular conductive layer.

FIG. 5 is a block diagram of the top-down perspective view illustratively depicting the exemplary microelectronic package after the addition of a molding layer and an oval conductive layer.

FIG. 6 is a block diagram of a cross-sectional view illustratively depicting an exemplary microelectronic package with inner and outer interference shielding cages.

FIG. 7-1 is a top-down perspective view illustratively depicting an exemplary microelectronic package having inner and outer interference protection.

FIG. 7-2 is the top-down perspective view illustratively depicting the exemplary microelectronic package of FIG. 7-1 after the addition of a conductive layer.

FIG. 7-3 is a cut-away diagram of the top-down perspective view illustratively depicting the exemplary microelectronic package of FIG. 7-1 after the addition of a molding layer and a conductive layer.

FIG. 8 is a block diagram of a cross-sectional view illustratively depicting an exemplary microelectronic package with inner and outer interference shielding cages.

FIG. 9-1 is a top-down perspective view illustratively depicting an exemplary microelectronic package having inner and outer interference protection.

FIG. 9-2 is the top-down perspective view illustratively depicting the exemplary microelectronic package of FIG. 9-1 after the addition of a conductive layer.

FIG. 11 is a block diagram of a top-down view illustratively depicting an exemplary microelectronic package.

FIG. 12-1 is a block diagram of a cross-section along A1-A2 of FIG. 11.

FIG. 12-2 is a block diagram of a cross-section along A1-A2 of FIG. 11 after addition of a molding layer.

FIGS. 14-1 and 14-2 are block diagrams of a top-down view illustratively depicting respective exemplary wire bond wire patterns for neighboring EMI isolation regions.

FIGS. 15-1 through 15-3 are block diagrams of a side view illustratively depicting respective exemplary wire bond wire patterns for neighboring EMI isolation regions.

DETAILED DESCRIPTION

Figure 2:
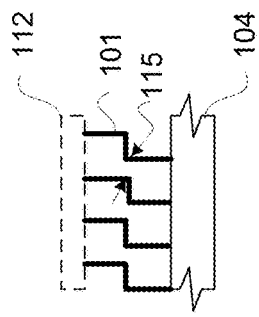

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Interference may be electromagnetic interference ("EMI"), including without limitation radio frequency interference ("RFI"), and/or another electrical and/or magnetic field that would produce undesirable EMI outside of the source generating the field. The following description of interference shielding may be used for EMI or other types of interference. EMI may be emitted from one device to another separate device, and compatibility of a device with respect to such out-of-package or out-of-device EMI emissions may be referred to as electromagnetic compatibility ("EMC"). For a device to have EMC, such a device may be precluded from emitting levels of EM energy sufficient to cause EMI harm in another device in an EMI environment of the EM emitting device. A common EMI emitting device is a mobile phone, and a mobile phone may have an EMC problem with respect to medical devices, which is a reason people are asked to turn-off their mobile phones in hospitals. For purposes of clarity by way of example and not limitation, generally only shielding from EMI is described below in additional detail; however, it shall become apparent from the following description that this shielding may also be used to enhance EMC. Along those lines, it will be appreciated that the following description is applicable to thin profile devices, such as mobile phones, wearables and/or Internet of Things devices, for reducing EM emission therefrom, and in some implementations enhancing EMC.

With the above general understanding borne in mind, various configurations for protection from interference are generally described below.

Along those lines, an apparatus generally relates to protection from electromagnetic ("EM") interference. In such an apparatus, a platform has an upper surface and a lower surface opposite the upper surface and has a ground plane. A microelectronic device is coupled to the upper surface of the platform. Wire bond wires are coupled to the ground plane. The wire bond wires have a pitch. The wire bond wires extend away from the upper surface of the platform with upper ends of the wire bond wires extending above an upper surface of the microelectronic device. The wire bond wires are spaced apart from one another to provide a fence-like perimeter to provide an interference shielding cage. A conductive layer is coupled to at least a subset of the upper ends of the wire bond wires for electrical conductivity to provide a conductive shielding layer to cover the interference shielding cage. To achieve enhanced suppression of EMI, spacings between each pair of adjacent wire bond wires may be substantially smaller than electrical wavelengths of interest, including without limitation the electrical wavelength of the highest operation frequency of interest. Along those lines, spacing between two adjacent wires can be less than approximately one tenth of the electromagnetic wavelength in a medium. For example, in a microelectronic package with conventional dielectric materials, the spacing between two adjacent wires can be less than 500 microns ("um") for an operational frequency of approximately 3 GHz, and less than 50 um for an operational frequency of approximately 30 GHz.

In the apparatus in the immediately preceding paragraph, the microelectronic device can be shielded from the interference outside of the interference shielding cage. The microelectronic device can be shielded by the interference shielding cage to reduce spread of the interference generated by the microelectronic device. The interference can be electromagnetic interference. The conductive layer can have an overhang extending beyond the perimeter. At least a subset of the wire bond wires can have gaps therebetween narrower than the pitch of at least the subset of the wire bond wires. The wire bond wires can have a /-like shape. The wire bond wires can have a ⌐-like shape. The wire bond wires can have a ⊓-like shape. The perimeter can have a shape corresponding to a layout of the microelectronic device. The perimeter can have a contour or non-parallel sides shape. The perimeter can have a circular shape. The microelectronic device can be a first microelectronic device, and the apparatus can further include a second microelectronic device coupled to the platform and located outside of the interference shielding cage. The platform can be selected from a leadframe, a circuit board, a substrate, and a redistribution layer. The wire bond wires having the pitch can be first wire bond wires having a first pitch, the interference shielding cage can be a first interference shielding cage having a first perimeter, and the conductive layer can be a first conductive layer; and the apparatus can further include: second wire bond wires coupled to the ground plane with a second pitch, with the second wire bond wires extending away from the upper surface of the platform with upper ends of the second wire bond wires being above an upper surface of the second microelectronic device and the upper ends of the first wire bond wires; the second wire bond wires can be spaced apart from one another to provide a second fence-like perimeter to provide a second interference shielding cage, with the first perimeter being within the second perimeter; and a second conductive layer can be coupled to at least a subset of the upper ends of the second wire bond wires for electrical conductivity to at least provide a shield cover over the first interference shielding cage and the second interference shielding cage including overlapping the first conductive layer for having the first interference shielding cage within the second interference shielding cage. The wire bond wires having the pitch can be first wire bond wires having a first pitch, and the interference shielding cage can be a first interference shielding cage having a first perimeter; and the apparatus can further include: second wire bond wires coupled to the ground plane with a second pitch, with the second wire bond wires extending away from the upper surface of the platform with upper ends of the second wire bond wires being above an upper surface of the second microelectronic device and at a same level as the upper ends of at least the subset of the first wire bond wires; the second wire bond wires can be spaced apart from one another to provide a second fence-like perimeter to provide a second interference shielding cage with the first perimeter being within the second perimeter; and the conductive layer can be coupled to at least a subset of the upper ends of the second wire bond wires for electrical conductivity to at least provide a shield cover over the second interference shielding cage. The first microelectronic device can be coupled to the second microelectronic device though a gap in the interference shielding cage. The first microelectronic device can be a stronger electromagnetic interference source than the second microelectronic device. The wire bond wires having the pitch can be first wire bond wires having a first pitch, and the interference shielding cage can be a first interference shielding cage having a first perimeter; and the apparatus can further include: second wire bond wires coupled to the ground plane with a second pitch wider than the first pitch to provide a second interference for providing a portion of a second interference shielding cage having less shielding against interference than the first interference shielding cage. The conductive layer can define a ring-like hole therein having a pad therein isolated from a remainder of the conductive layer by the ring-like hole. The conductive layer can be a ground plane. The pad can be a signal pad or a power pad. The wire bond wires having the pitch can be first wire bond wires having a first pitch, and the interference shielding cage can be a first interference shielding cage having a first perimeter; and the apparatus can further include: second wire bond wires coupled to the ground plane with a second pitch with the second wire bond wires extending away from the upper surface of the platform with upper ends of the second wire bond wires being above an upper surface of the second microelectronic device and at a same level as the upper ends of at least the subset of the first wire bond wires; the second wire bond wires can be spaced apart from one another to provide a second fence-like perimeter in combination with a portion of the first wire bond wires to provide a second interference shielding cage with the first perimeter bordering the second perimeter; and the conductive layer can be coupled to at least a subset of the upper ends of the second wire bond wires for electrical conductivity to at least provide a shield cover over the second interference shielding cage.

A method relates generally to protection from EM interference. In such a method, a platform is obtained having an upper surface and a lower surface opposite the upper surface and having a ground plane. A microelectronic device is coupled to the upper surface of the platform. Wire bond wires are bonded to the ground plane, where the wire bond wires have a pitch. The wire bond wires extend away from the upper surface of the platform with upper ends of the wire bond wires being above an upper surface of the microelectronic device. The wire bond wires are spaced apart from one another to provide a fence-like perimeter to provide an interference shielding cage. A molding layer is deposited over the upper surface of the platform. A conductive layer is formed for coupling to at least a subset of the upper ends of the wire bond wires to provide a conductive shielding layer for electrical conductivity to cover the interference shielding cage.

Other features will be recognized from consideration of the description and claims, which follow.

Figures 2, 3, 4, 5:
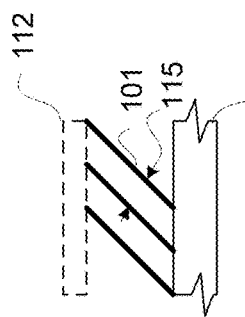
Figures 2, 3:
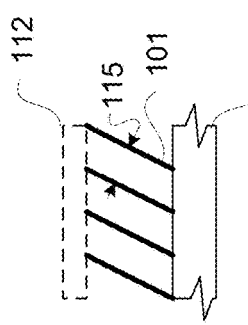
Figures 2, 3, 4, 5, 6:
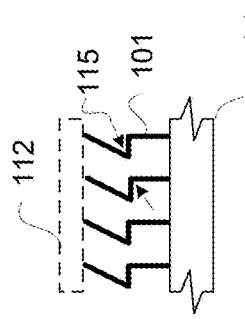
Figures 2, 3, 4, 5, 6, 7:
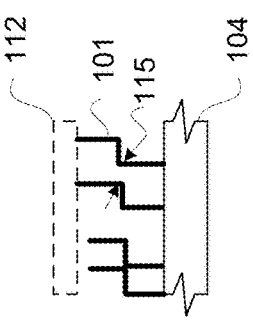
Figures 1, 2:
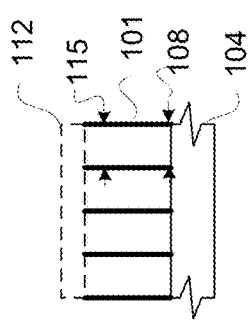
Figures 2, 3, 4:
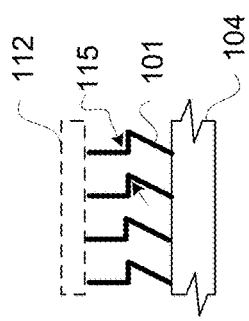
Figures 2, 3:
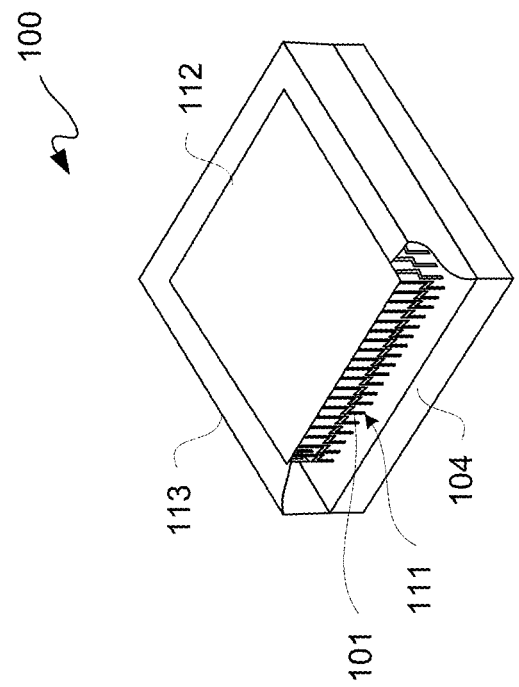
Figures 1, 3:
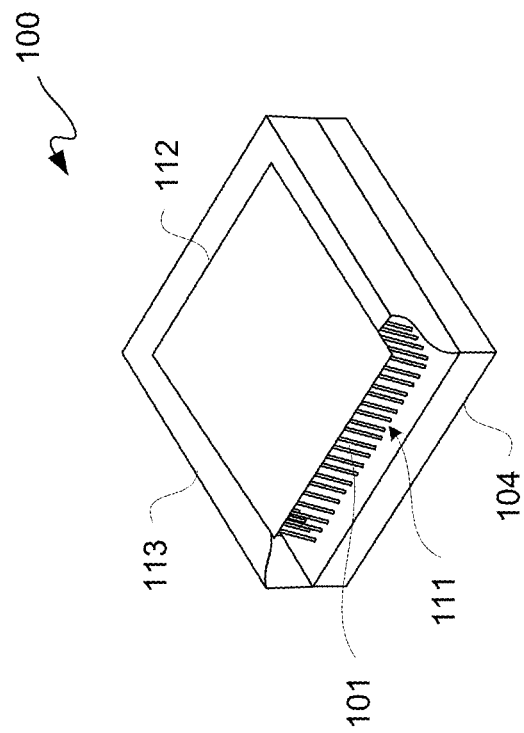
Figure 6:
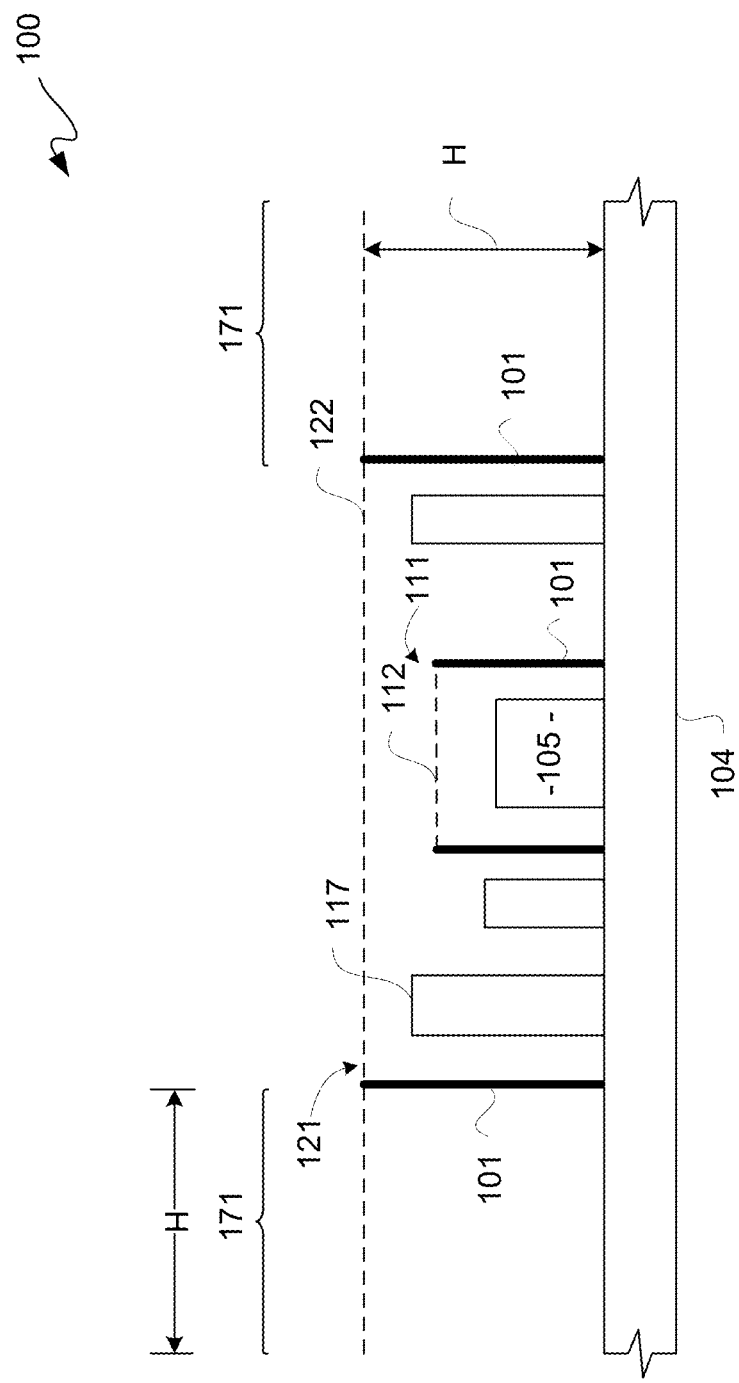
Figures 1, 2, 7:
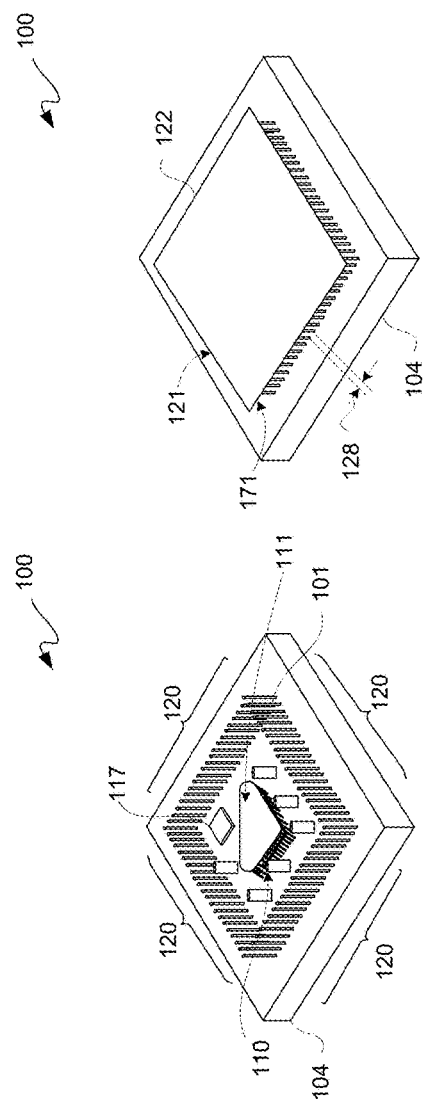
Figures 3, 7:
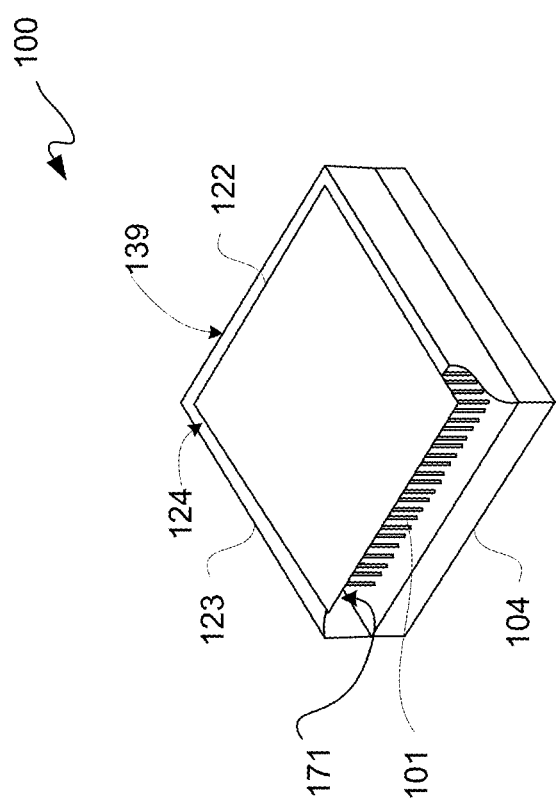

FIG. 1-1 is a top-down perspective view illustratively depicting an exemplary microelectronic package 100 having interference protection. FIG. 1-2 is the top-down perspective view illustratively depicting the exemplary microelectronic package 100 of FIG. 1-1 after the addition of a conductive layer 112. With simultaneous reference to FIGS. 1-1 and 1-2, microelectronic package 100 is further described.

In microelectronic package 100, a platform 104 has an upper surface 102 and a lower surface 106 opposite upper surface 102. Platform 104 further includes a ground plane 107, which in this example is subsurface with respect to upper surface 102, with surface accessible bond pads (not shown in this figure for purposes of clarity and not limitation) coupled to such ground plane 107. Platform 104 may be selected from a leadframe, a circuit board, a redistribution layer, a substrate, or other circuit base.

A microelectronic device 105 may be coupled to other bond pads (not shown in this figure for purposes of clarity and not limitation) on upper surface 102 of platform 104. Microelectronic device 105 for example may be an integrated circuit die, such as a resonator for example, or any other microelectronic component that generates EMI noise. Wire bond wires 101 may be coupled to ground plane 107 with a pitch 108. Wire bond wires 101 extend away from upper surface 102 of platform 104 with upper ends 103 of wire bond wires 101 being above an upper surface 109 of microelectronic device 105. For purposes of clarity by way of example and not limitation, wire bond wires 101 may have a height of approximately 0.4 mm and a diameter of 20 microns, with a pitch of approximately 80 microns. Distance between a wire bond wire 101 used to provide a perimeter for shielding and a microelectronic device 105 may be approximately 0.5 mm. An interference shielding cage in accordance therewith may provide approximately 30 to 33 dB of EMI suppression at maximum radiation direction for a frequency in a range of approximately 3.0 to 4.5 GHz with E-field radiation and radiation power both reduced by approximately over 97 percent or higher. By implementing EMI shielding as described herein, applications with operating frequencies of 5 GHz or greater frequencies may be have EMI suppression as described herein, including without limitation EMC enhancement. However, these or other parameter details to provide EMI shielding may be used as may vary from application-to-application.

Wire bond wires 101 are spaced apart from one another to provide a picket fence-like wall or perimeter 110. Such a picket-fence like or bars on a cage-like perimeter of wire bond wires 101 may be used to provide an interference shielding wall for an interference shielding cage 111, such as a bond via array ("BVA") cage. Interference shielding cage 111 further includes a conductive layer 112 having a lower surface. Such lower surface of conductive layer 112 may be mechanically coupled, such as by applying solder or other eutectic masses to at least a subset, if not all, of upper ends 103 of wire bond wires 101 to provide attachment of a conductive shielding layer for electrical conductivity to cover interference shielding cage 111. Conductive surface 112 in this example is a sheet material, which may be used to provide an EMI shield cap or cover of an interference shielding cage 111. However, in another implementation, a mesh of material may be deposited for use as a shield cover of an interference shielding cage 111.

FIG. 1-3 is a cut-away diagram of the top-down perspective view illustratively depicting the exemplary microelectronic package 100 of FIG. 1-1 after the addition of a molding layer 113 and a conductive layer 112. In this optional implementation, after forming molding layer 113 over upper surface 102 and around bases and shafts of wire bond wires 101, at least a subset, if not all, of upper ends 103 of wire bond wires 101 may be temporarily exposed above an upper surface 114 of molding layer 113. A mold assist film (removed in this figure) may be used in an injection mold for example to have upper ends 103 available for mechanical or other coupling. In this implementation, upper ends of wire bond wires 101 do not have to be exposed by back grinding, planarizing, etching back, polishing or otherwise from molding layer 113.

Along those lines, conductive layer 112 may be mechanically coupled as previously described. However, optionally conductive layer 112 may be formed by spraying, sputtering, printing, painting, ink stamping, or otherwise forming a conductive shielding layer on upper surface 114 for interconnect with upper ends 103. By forming conductive layer 112 by spraying, sputtering, printing, painting, ink stamping, or otherwise depositing a conductive material, conductive layer 112 may be selectively applied. Along those lines, a mesh or solid surface, or a combination of part mesh and part solid surface, for conductive layer 112 may be formed.

For purposes of clarity, conductive layer 112 is illustratively depicted as extending toward a front edge 139 of microelectronic package 100 and covering only a portion of an upper surface 114 of molding layer 113. However, in another implementation, conductive layer 112 may extend to none, or one or more edges 139 of microelectronic package 100. Along those lines, FIG. 1-4 is a block diagram of the top-down perspective view illustratively depicting the exemplary microelectronic package 100 of FIG. 1-1 after the addition of a molding layer 113 and a conductive layer 112, where conductive layer 112 covers an upper surface of microelectronic package 100.

In this example, there are four edges 139 to which conductive layer 112 extends; however, conductive layer 112 may be formed to cover an upper surface area of any shape of a microelectronic package 100. By having conductive layer 112 overhang or otherwise extend beyond a perimeter 110 formed by wire bond wires 101 associated with an interference shielding cage 111, EMI shielding may be enhanced over a corresponding interference shielding cage 111 where conductive layer 112 does not extend beyond perimeter 110 formed of wire bond wires 101. For minimally effective EMI shielding, such an overhang or extension may be approximately minimally half of the vertical or perpendicular height ("H") of wire bond wires 101. Thus, a perimeter of conductive layer 112 may be greater than a surface area associated with a perimeter 110 of wire bond wires 101 of an interference shielding cage 111 minimally by ½ H in each direction toward one or more edges 139. Though a ½ H overhang can reduce EMI emissions, such as of an evanescent or standing wave, a larger overhang may suppress EMI emission further, as EMI emission may include both radial emission and an evanescent wave. Based on electromagnetic wave theory, only the lowest transverse electric (TE) mode is propagation wave, other higher order modes are evanescent waves that decay to negligible small after propagating distance of perpendicular height H. Thus, an overhang of H can significantly further suppress the EMI radiation. Along those lines, an overhang for extending conductive layer 112 beyond perimeter 110 in each direction by approximately H may be used. Thus, conductive layer 112 may be extended to all edges 139 of a package part for an overhang of H or greater beyond perimeter 110 in all directions toward edges 139.

In any of the above configurations, microelectronic device 105 may be shielded from interference outside of interference shielding cage 111, such as outside of a perimeter 110 of wire bond wires 101. However, for purposes of clarity by way of example and not limitation, it shall be assumed that during operation microelectronic device 105 is an EMI generator. Along those lines, microelectronic device 105 may be shielded by interference shielding cage 111, such as by perimeter 110 of wire bond wires 101, to reduce or prevent spread of EMI, namely size of an EM environment, generated by microelectronic device 105. For example, interference generated by microelectronic device 105 without interference shielding cage 111 may generate an EMI environment affecting EMC. For purposes of clarity by way of example and not limitation, it shall be assumed that microelectronic device 105 is an RF component. Microelectronic device 105 may be a stacked die, such as a 3D IC or may be shielded from such a stacked die.

FIGS. 2-1 through 2-7 are respective block diagrams of side views illustratively depicting exemplary profiles of wire bond wires 101. In FIG. 2-1, wire bond wires 101 have a generally vertical profile, such as previously described. Along those lines, gaps between such generally vertical profile wire bond wires 101 may have a generally consistent pitch 108, where such wire bond wires 101 are bonded for example to platform 104, and closest spaces or gaps 115 between such wires moving up from such platform 104 may be generally a consistent spacing or gapping. Routing wiring, such as signal, power, or ground traces for microelectronic package 100 may extend through one or more gaps between adjacent wire bond wires 101. Thus, wiring layers (not shown) may include routing on upper surface 102 of platform 104 without interfering with corresponding EMI shielding, thereby simplifying routing over traditional "can" style EMI shielding mechanisms, which would experience an electrical short if the solid conductive surface contacted surface routing.

For FIGS. 2-2 through 2-7, the closest spacings of gaps 115 may be narrower than pitch 108. By "pitch", it is generally meant a predetermined center-to-center spacing between bases of wire bond wires, which may be contrast for example from slant of such wire bond wires. Along those lines, at least a subset, if not all, of wire bond wires 101 may have gaps 115 therebetween narrower than a corresponding pitch 108 of at least a subset of wire bond wires 101. Wire bond wires 101 may have a slash-like or "/" shape or profile, such as in FIGS. 2-2 and 2-6. In FIG. 2-3, wire bond wires 101 have a squared-off vertical-z-like, or a kinked or rounded shaped profile. Of course, the wires shown by way of example in FIGS. 2-1 through 2-7 may have additional bends not shown in the schematic drawings. For instance, the "/" shaped wires may have portions that do not have a straight line profile and instead have slightly more vertical or horizontal portions at either end due to tooling parameters. Thus, the wire may have be considered to have an imaginary axis extending from one end of the wire to the other with portions of the wire bond extending outside of that axis in the x, y, and/or z directions.

In FIGS. 2-4 and 2-5 wire bond wires may have a vertical partial four-like shape or profile. Other shapes, such as chevron ("<" or ">" shapes), arc ("(" or ")" shapes), or coil shaped configurations are optional. Even though non-curved angles and/or segments are illustratively depicted, in other implementations, such angles and/or segments may have curves, such as for example a curved-el-like profile shape. Moreover, wire bond wires 101 may be loops, such as having an open loop omega-like "Ω" shaped profile or a closed loop el-like "l" shaped profile. The wire loops may each be formed on a single pad and may be offset or angled relative to each other in the x and y direction (i.e., in a layout similar to "\\\" when viewed down the z direction) to facilitate a more tightly packed layout than might be possible if the wires in the wire loop extended in the same plane (i.e., in a layout similar to "- - - " when viewed down the z direction).

FIG. 3-1 is the exemplary microelectronic package 100 though with slash-like shaped wire bond wires 101, and FIG. 3-2 is the exemplary microelectronic package 100 though with squared-off vertical-z-like shaped wire bond wires 101. Along those lines, pitch, shape, and diameter of wire bond wires 101, including without limitation irregularly shaped wire bond wires 101, may be used to further reduce EM emissions from a fence-like perimeter, such as perimeter 110 for example, formed of wire bond wires 101. Some of adjacent wire bond wires 101 may be in contact with each other, and some wires 101 may not extend to conductive layer 112, such as illustrative depicted in FIG. 2-7 for purposes of clarity by way of example and not limitation, and these or other options described herein may be selectable by a designer for a given EMI shield design or characteristic.

As above with reference to FIG. 1-1, perimeter 110 formed by layout of wire bond wires 101 may have a shape corresponding to a layout of microelectronic device 105. However, microelectronic device 105 may have a layout shape other than that of a square, rectangle or other similar polygon. Moreover, microelectronic device 105 may have a layout shape of a circle, oval or other curvilinear shape. Shaping fence-like perimeters, such as for example perimeter 110 and/or below described perimeter 120, formed of wire bond wires 101 to a microelectronic device 105 layout shape or footprint may be used to provide more compact designs and/or better shielding performance than not contouring fence-like perimeters to such footprint.

FIG. 4-1 is a top-down perspective view illustratively depicting an exemplary microelectronic package 100 having interference protection, as in FIG. 1-1, though with a triangularly shaped microelectronic device 105. Correspondingly, perimeter 110 formed of wire bond wires 101 may have a corresponding triangular shape. In this example, wire bond wires 101 have a slash-like profile. FIG. 4-2 is a cut-away diagram of the top-down perspective view illustratively depicting the exemplary microelectronic package 100 of FIG. 4-1 after the addition of a molding layer 113 and a triangular conductive layer 112. Accordingly, more generally, a perimeter may have one or more contoured sides, non-parallel sides and/or non-orthogonal sides in order to follow a layout of an irregularly shaped microelectronic device 105.

FIG. 5 is a block diagram of the top-down perspective view illustratively depicting the exemplary microelectronic package 100 after the addition of a molding layer 113 and a conductive layer 112. Circles 116 generally indicate upper ends of wire bond wires 101 positioned for providing an oval shaped perimeter 110 of wire bond wires 101, as previously described though for an oval shaped microelectronic device 105. Microelectronic devices 105 as described herein may be passive or active devices. Conductive layer 112 may have an oval shape as generally indicated by dashed oval 112A. However, conductive layer 112 may overhang an oval shaped perimeter 110 and need not be contoured like perimeter 110. Thus, for example, conductive layer 112 may extend to edges of a package, as generally indicated by arrow 112B. Moreover, in another implementation, conductive layer 112 may have an oval shape to extend beyond perimeter 110, as generally indicated by dashed oval 112C.

FIG. 6 is a block diagram of a cross-sectional view illustratively depicting an exemplary microelectronic package 100 with inner and outer interference shielding cages 111 and 121, respectively. In this example, inner interference shielding cage 111 has therein a microelectronic device 105 surrounded by a perimeter of wire bond wires 101, where location of a conductive layer 112 is generally indicated with a dashed line bridging such wire bond wires 101, such as previously described for example. In this example, conductive layer 112 of inner interference shielding cage 111 does not overhang or extend beyond an inner perimeter formed of wire bond wires 101.

An outer interference shielding cage 121 has one or more microelectronic devices 117, as well as inner interference shielding cage 111, therein. One or more of microelectronic devices 117 may be taller than microelectronic device 105. In other words, an upper surface of such one or more taller microelectronic devices 117 may be above, though not necessarily overlapping, an upper surface of microelectronic device 105.

Microelectronic devices 117 may be coupled to an upper surface of platform 104 and may be located outside of inner interference shielding cage 111. In this example, inner interference shielding cage 111 is surrounded by a perimeter of wire bond wires 101 of outer interference shielding cage 121. For outer interference shielding cage 121, location of a conductive layer 122 therefor is generally indicated with a dashed line bridging such wire bond wires 101, such as previously described with reference to conductive layer 112 for example, as well as extending beyond an outer perimeter of wire bond wires 101 of outer interference shielding cage 121.

Having both inner and outer interference shielding cages 111 and 121 within a same plot may be used for different types or levels of interference noise, such as EMI and EMC for example, as well as more or less compact and/or complex shielding implementations as described elsewhere herein. Along those lines, an overhang or eave 171 may extend beyond each side of a perimeter of wire bond wires 101 of outer interference shielding cage 121 by approximately a distance H, for H also a vertical height of wire bond wires 101 used to provide such a perimeter.

FIG. 7-1 is a top-down perspective view illustratively depicting an exemplary microelectronic package 100 having inner and outer interference protection. FIG. 7-2 is the top-down perspective view illustratively depicting the exemplary microelectronic package 100 of FIG. 7-1 after the addition of conductive layer 122. With simultaneous reference to FIGS. 1-1 through 7-2, microelectronic package 100 of FIGS. 7-1 and 7-2 is further described. As much of the above description is applicable to describing microelectronic package 100 of FIGS. 7-1 and 7-2, some of such description is not repeated for purposes of clarity and not limitation.

Inner perimeter wire bond wires 101 may have a pitch 108 for an inner interference shielding cage 111 having a conductive layer 112. Conductive layer 112 may not have sufficient room for an overhang. Outer wire bond wires 101 may be coupled to a ground plane 107 though with a same or different pitch 128 with reference to pitch 108. Outer wire bond wires 101 extend away from an upper surface of platform 104 with upper ends 103 of outer wire bond wires 101 being above an uppermost upper surface of microelectronic devices 117, as well as above upper ends of inner wire bond wires 101 and inner conductive layer 112.

Outer wire bond wires 101 may be spaced apart from one another to provide an outer picket fence-like perimeter 120 to provide an outer interference shielding cage 121. Inner perimeter 110 may be completely within outer perimeter 120.

An upper conductive layer 122 may be coupled to at least a subset of upper ends 103 of outer wire bond wires 101 for electrical conductivity to cover inner interference shielding cage 111 and outer interference shielding cage 121, where upper conductive layer 122 is above and overlapping inner-lower conductive layer 112 for having inner interference shielding cage 111 within outer interference shielding cage 121. Outer interference shielding cage 121 may be for EMC shielding, whereas inner interference shielding cage 111 may be for EMI shielding. Along those lines, conductive layer 122 may extend beyond perimeter 120 to provide an overhang 171, of at least approximately ½ H in order to enhance EMC, and overhangs greater than ½ H, such as an overhang of at least H may provide more EMI evanescent wave suppression.

Even though a mechanical coupling is illustratively depicted in FIG. 7-2, such coupling of conductive layer 122 may be after forming another molding layer over molding layer 113. FIG. 7-3 is a cut-away diagram of the top-down perspective view illustratively depicting the exemplary microelectronic package 100 of FIG. 7-1 after the addition of a molding layer 123 and a conductive layer 122. In this optional implementation, after forming molding layer 123 over conductive layer 112 and molding layer 113, at least a subset, if not all, of upper ends 103 of outer wire bond wires 101 may be temporarily exposed above an upper surface 124 of molding layer 123. A mold assist film (removed in this figure) may be used in an injection mold for example to have upper ends 103 of outer wire bond wires 101 available for mechanical or other coupling.

Along those lines, conductive layer 122 may be mechanically coupled as previously described. However, optionally conductive layer 122 may be formed by spraying, sputtering, printing, painting, ink stamping, or otherwise forming a conductive shielding layer on upper surface 124 for interconnect with upper ends 103 of outer wire bond wires 101. Conductive layer 122 may provide an overhang 171, which may or may not extend to outer edges 139 of microelectronic package 100. Conductive layer 122 is illustratively depicted as being short of outer edges 139 in order to more clearly indicate a perimeter of conductive layer 122.

FIG. 8 is a block diagram of a cross-sectional view illustratively depicting an exemplary microelectronic package 100 with inner and outer interference shielding cages 111 and 121, respectively. In this example, inner interference shielding cage 111 has therein a microelectronic device 105 surrounded by a perimeter of wire bond wires 101, where location of a conductive layer 122 is generally indicated with a dashed line bridging such wire bond wires 101. In this example, conductive layer 122 provides a common cover for both of inner interference shielding cages 111 and 121 and also provides an overhang 171 to extend beyond an outer perimeter formed of wire bond wires 101 by approximately ½ H.

An outer interference shielding cage 121 has one or more microelectronic devices 117, as well as inner interference shielding cage 111, therein. One or more of microelectronic devices 117 may be taller than microelectronic device 105. In other words, an upper surface of such one or more taller microelectronic devices 117 may be above, though not necessarily overlapping, an upper surface of microelectronic device 105.

Microelectronic devices 117 may be coupled to an upper surface of platform 104 and may be located outside of a perimeter of inner interference shielding cage 111. In this example, inner interference shielding cage 111 is surrounded by a perimeter of wire bond wires 101 of outer interference shielding cage 121. Location of a conductive layer 122 is generally indicated with a dashed line bridging wire bond wires 101 for both inner interference shielding cage 111 and outer interference shielding cage 121, namely being an EMI shielding cover common to both of cages 111 and 121 without having a separate cover for inner interference shielding cage 111. Conductive layer 122 extends beyond an outer perimeter of wire bond wires 101 of outer interference shielding cages 121. Having both inner and outer interference shielding cages 111 and 121 within a same plot may be used for different types or levels of interference noise, such as EMI and EMC for example, as well as more compact and less complex shielding implementations. Along those lines, an overhang or eave 171 may extend beyond each side of a perimeter of wire bond wires 101 of each outer interference shielding cage 121 by approximately at least a distance ½ H, for H also a vertical height of wire bond wires 101 used to provide such a perimeter. Effectively, because a common conductive layer 122 is used for both outer interference shielding cages 121 and inner interference shielding cage 111, common sections 172 provide overhangs 173 for EMI shielding, such as for EMI suppression of higher order modes and evanescent waves.

Figures 1, 2, 9:
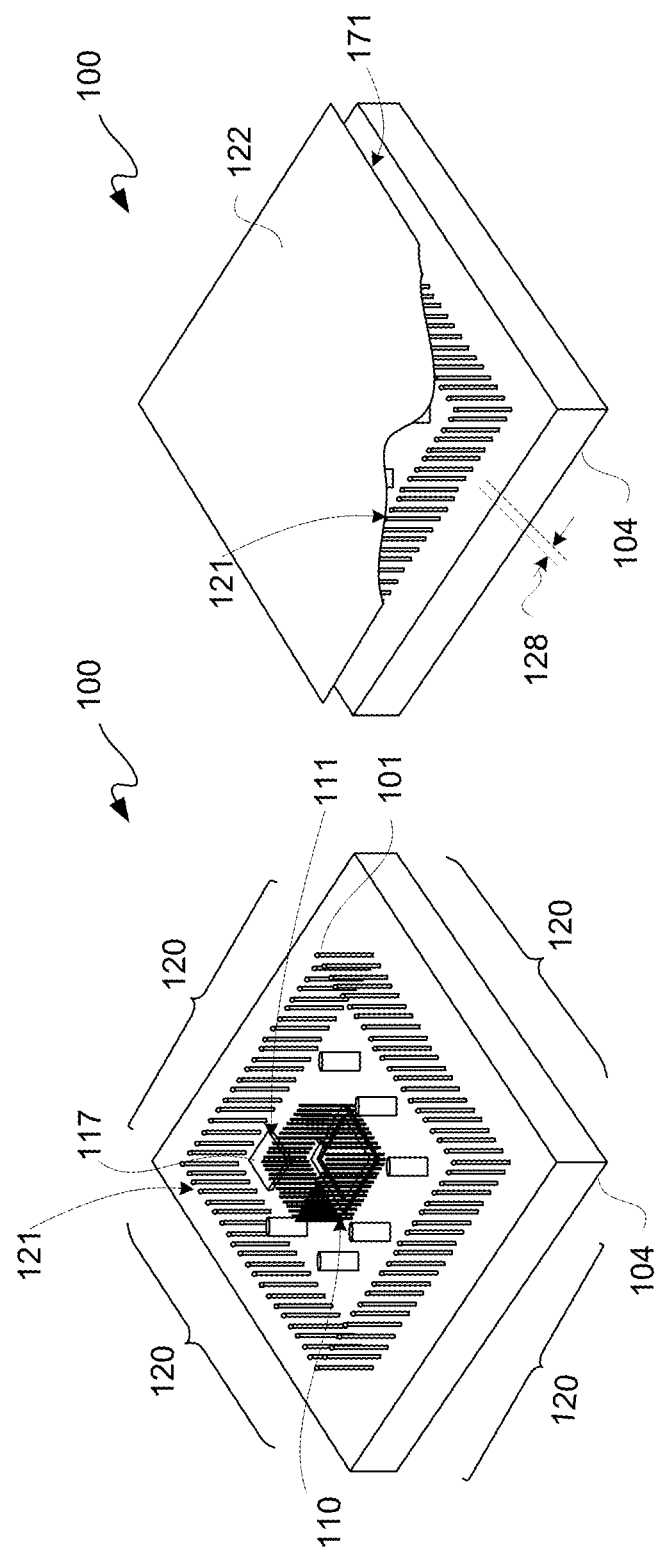

FIG. 9-1 is a top-down perspective view illustratively depicting an exemplary microelectronic package 100 having inner and outer interference protection. FIG. 9-2 is the top-down cutaway perspective view illustratively depicting the exemplary microelectronic package 100 of FIG. 9-1 after the addition of conductive layer 122. With simultaneous reference to FIGS. 1-1 through 9-2, microelectronic package 100 of FIGS. 9-1 and 9-2 is further described. As much of the above description is applicable to describing microelectronic package 100 of FIGS. 9-1 and 9-2, some of such description is not repeated for purposes of clarity and not limitation.

Inner perimeter wire bond wires 101 may have a pitch 108 for an inner interference shielding cage 111 having a separate conductive layer 112 independent of another interference shielding cage or having a common conductive layer 122 for a common cover with another interference shielding cage. Outer wire bond wires 101 of outer interference shielding cage 121 may be coupled to a ground plane 107, though with a same or different pitch 128 with reference to pitch 108 as inner wire bond wires 101 of inner interference shielding cage 111. Outer wire bond wires 101 coupled to ground plane 107 with a pitch 128 wider than pitch 108 may be for EMC for providing an outer interference shielding cage 121 having less shielding against EMI than inner interference shielding cage 111. Conductive layer 122 may have an overhang 171 extending beyond a perimeter 120 of outer wire bond wires 101 for enhancing EMC.

Outer wire bond wires 101 extend away from an upper surface of platform 104 with upper ends 103 of outer wire bond wires 101 being above an uppermost upper surface of microelectronic devices 117, but at a same level as upper ends of at least a subset, if not all, of inner wire bond wires 101 with no inner conductive layer 112.

Outer wire bond wires 101 may be spaced apart from one another to provide an outer picket fence-like perimeter 120 to provide an outer interference shielding cage 121. Inner perimeter 110 may be completely within outer perimeter 120.

A conductive layer 122 may be mechanically coupled to at least subsets of upper ends 103 of both inner and outer wire bond wires 101 for electrical conductivity to cover inner interference shielding cage 111 and outer interference shielding cage 121, where conductive layer 122 is above and overlapping inner interference shielding cage 111 within outer interference shielding cage 121. Outer interference shielding cage 121 may be for EMI and/or EMC shielding, and inner interference shielding cage 111 may be for EMI shielding, with a single conductive layer 122 for providing a ceiling for both inner and outer interference shielding cages.

Again, even though a mechanical coupling is illustratively depicted in FIG. 9-2, such coupling of conductive layer 122 may be after forming another molding layer 123 over molding layer 113, as previously described.

Even though concentric inner and outer perimeters 110 and 120 of wire bond wires 101 has been described for forming inner and outer interference shielding cages 111 and 121, respectively, a microelectronic package 100 may include multiple types of interference shielding cages in accordance with the description herein.

Figure 10:
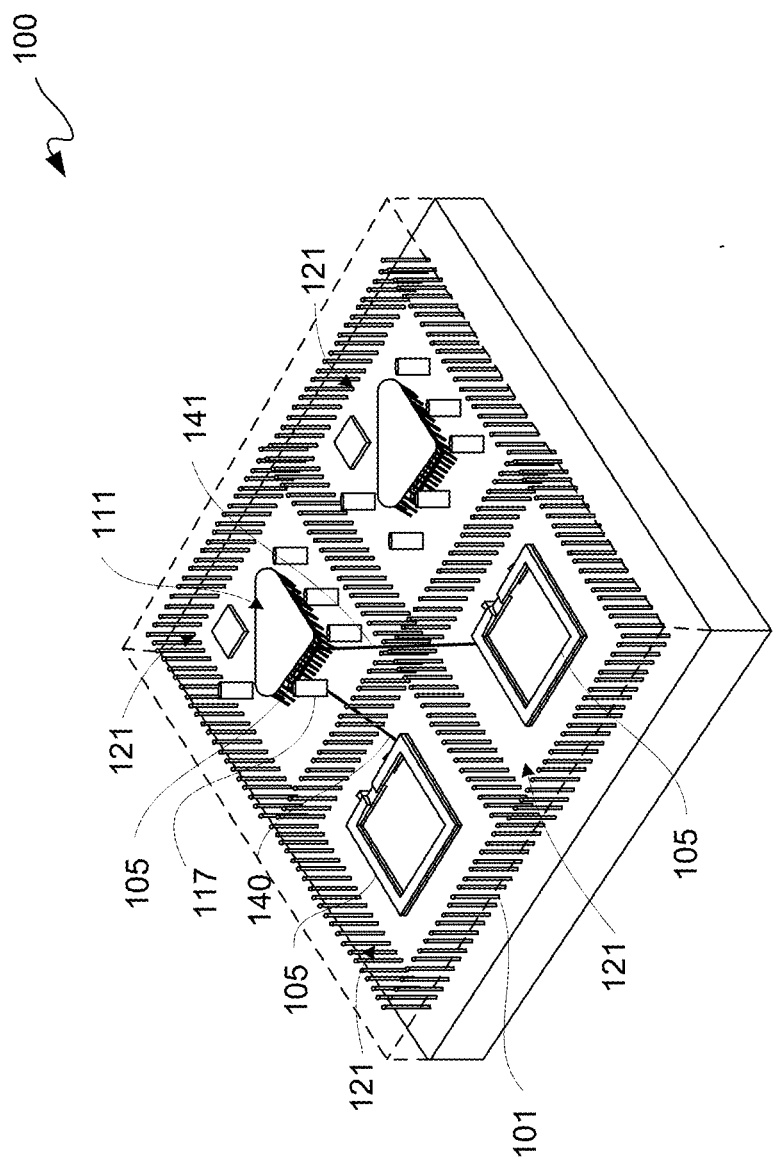
FIG. 10 is a top-down perspective view illustratively depicting an exemplary microelectronic package having plots for interference shielding cages as in FIG. 1-1 and as in FIG. 7-1 for example.

Along those lines, FIG. 10 is a top-down perspective view illustratively depicting an exemplary microelectronic package 100 having plots for interference shielding cages as in FIG. 1-1 and as in FIG. 7-1 for example. With simultaneous reference to FIGS. 1-1 through 10, microelectronic package 100 of FIG. 10 is further described, while much of the above description which is the same is not repeated for purposes of clarity and not limitation.

Though four plots with both one and two interference shielding cages are illustratively depicted, other combinations of plots as described herein may be implemented in other configurations of microelectronic package 100. In this configuration, wire bond wires 101 forming one or more picket fence-like perimeters 110 and/or 120 of one plot may be adjacent another picket fence-like outer perimeter 110 or 120. Thus, a portion of one picket fence-like perimeter may be used in combination with a portion of a neighboring or bordering picket fence-like perimeter to provide an interference shielding cage. Along those lines, a multiplex of interference shielding cages 121, with or without one or more inner interference shielding cages 111, may be provided with a single microelectronic package 100. Inner perimeters 110 of these interference shield cages 111 provided by wire bond wires 101 may, but do not need to, run perpendicular to an edge or follow a straight line. Rather, such inner perimeters can be laid out or shaped to follow a contour or other irregular pattern. Conductive layer 122, which is left off for clarity in FIG. 10, may be formed over multiple outer interference shielding cages 121, as previously described herein.

A microelectronic device 105 in an inner or only interference shielding cage 111 or a microelectronic device 117 in an outer interference shielding cage 121 of a plot may be coupled to another microelectronic device 105 or 117 in another interference shielding cage 111 or 121 in another plot by routing between pairs of adjacent wire bond wires 101 in one or more intervening perimeters 110 and/or 120, such as routings 140 and 141 for example. By coupling microelectronic devices between one or more gaps in one or more interference shielding cages, a microelectronic device which is a stronger EMI source, such as a signal pad without grounding, than another microelectronic device, such as a ground pad which may not be caged, may be directly coupled to one another while still providing sufficient EMI shielding to such stronger EMI source. This may be used for more compact designs with fewer fences to provide sufficient shielding.

Furthermore, it should be understood that one interference shielding cage 121 may directly border, space apart or not, another interference shielding cage 121 without having to provide isolation gaps, such as in a molding layer for example, for electrical isolation between such neighboring interference shielding cages. By routing through fences of cages as described herein, routing may be at lower levels, rather than having to run such routing over on top of a microelectronic package. In conventional isolation, trenches are formed which can significantly increase topside routing complexity, and this complexity may be significantly reduced with routing through cage fences, in addition to not having EMI isolation trenches. Moreover, wire bond wires 101 may be shared among such neighboring interference shielding cages, as previously described. Accordingly, either or both of these configurations may be used to provide a more densely populated microelectronic package 100, namely a microelectronic package that has a smaller footprint.

FIG. 11 is a block diagram of a top-down view illustratively depicting an exemplary microelectronic package 100, and FIG. 12-1 is a block diagram of a cross-section along A1-A2 of FIG. 11. With simultaneous reference to FIGS. 1 through 12-1, microelectronic package 100 of FIGS. 11 and 12-1 is further described.

A conductive layer 112 or 122 may be a ground plane, which as a hole 160, such as a ring-like hole, cut or ablated therein, such as laser ablated for example, to define an electrical island or pad 161 therein, namely pad 161 is not in contact with, nor isolated from, a remainder of conductive layer 112 or 122. Pad 161 may be a signal pad or a power pad coupled to at least one wire bond wire 101C, not part of an interference shielding cage 111 or 121, located for interconnection with pad 161. Isolation of pad 161 may be used for system-in-package ("SiP") integration. As one example, a decoupling capacitor or other passive or active device may be coupled to one or more of such isolated pads 161. This implementation allows passive and/or active devices to be placed on a level above EMI shielding with interconnects through microelectronic package 100 formed at the same time as one or more interference shielding cages, thereby simplifying package processing. Of course, multiple pads 161 maybe formed singularly or in an array of two or more pads. Devices may be attached to one or more pads 161, conductive layer 112/122, or both, for an application. Moreover, while pad 161 is illustratively depicted as surrounded by a conductive layer, this is for illustrative purposes only. Conductive layer 112/122 may be generally adjacent to only one or more of the sides of contact pad 161.

FIG. 12-2 is a block diagram of a cross-section along A1-A2 of FIG. 11 after addition of a molding layer 113. With simultaneous reference to FIGS. 1 through 12-2, microelectronic package 100 of FIGS. 11 and 12-2 is further described. In another implementation, one or more pads 161 may be selectively formed on an upper surface of a molding layer 113. Along those lines, molding layer 113 may be a dielectric, and such one or more pads 161 may be electrically isolated from one another along an upper surface of molding layer 113. By forming conductive layer 112 by plating, spraying, sputtering, printing, painting, ink stamping, or otherwise selectively depositing a conductive material, conductive layer 112 may be selectively applied in any applicable pattern or design to an upper surface of molding layer 113.

Figure 13:
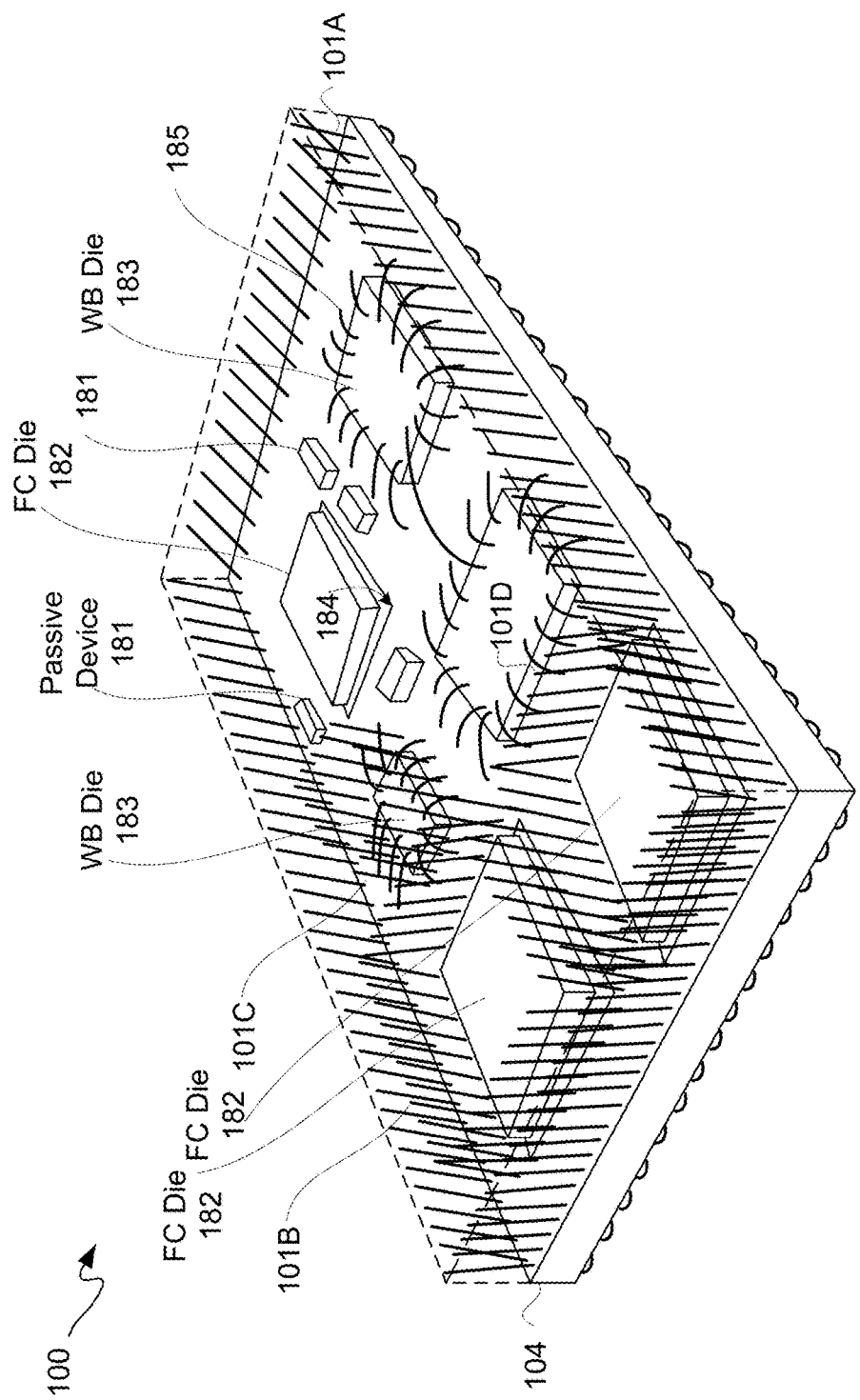
FIG. 13 is a top-down perspective view illustratively depicting an exemplary microelectronic package having interference shielding cages.

FIG. 13 is a top-down perspective view illustratively depicting an exemplary microelectronic package 100 having interference shielding cages, as described above. In this example, interference shielding cages may include multiple odd-shaped divisions or sections. Thus, there may be multiple isolation zones, which need not, though may, be orthogonal to one another. FIG. 13 is further described with simultaneous reference to FIGS. 1 through 13.

Along those lines, microelectronic package 100 may be a SiP having passive devices 181, flip-chip ("FC") dies 182, and wire bond ("WB") dies 183 all coupled to an upper surface 102 of a platform 104. WB dies 183 may be bonded to platform 104 with wire bonds 185. The wire bonds 185 and/or surface traces (not shown) on platform 104 may be configured to extend between adjacent wire bond wires 101A-101D to other die, or to pads located on the platform 104, on the other side of an EMI shielded area. In certain implementations, this allows the EMI shield wire bond wires 101A-101D to be formed closer to the EMI source or EMI protected device than the pad on the the platform 104. This also allows for more routing flexibility through the sides of the EMI cage than would be possible through conventional techniques such as those EMI shields configured using either a solid conductive side surface or wire bond arches. Other interconnection techniques are shown in FIG. 13, such as FC dies 182 being "flip-chip" coupled to platform 104, along with having an underfill layer 184 for such coupling.

Wire bond wires 101B and 101D may form separate EMI shielding perimeters, such as perimeters 110 for example, around respective FC dies 182. Wire bond wires 101C may form a separate EMI shielding perimeter, such as a perimeter 110 for example, around a WB die 183. Wire bond wires 101A may form an EMI shielding perimeter, such as a perimeter 120 for example, around components coupled to upper surface 102 of platform 104 for EMI shielding to enhance EMC.

A SiP may be a number of active or/and passive components enclosed in a single IC package module, such as microelectronic package 100. SiPs are widely used in RF applications, including without limitation mobile devices, wearables and Internet of Things ("IoT") devices. For example, an RF SiP can contain some active chips such as one or more ASIC and/or memory chips, and some passive components such as RF resistors, capacitors, inductors, oscillators, etc. A SiP is particularly useful in space constrained environments, as a SiP significantly reduces complexity of a printed circuit board ("PCB") and system design. Recently, SiPs are attracting interest in small form factor electronics, including without limitation IoT devices.

It should be appreciated that issues of EMI and EMC may be more problematic in future SiP designs because more components with multiple frequencies may be integrated into a single RF SiP. For example, a SiP for 5G wireless devices may handle multiple RF functions including WiFi, 3G, 4G LTE, ZigBee, etc. However, by having the ability to selectively apply wire bond wire perimeters for EMI shielding, as previously described, EMI shielding may be provided for different domains within a same SiP. Wire bond wires 101 may be implemented with high-frequency wire bonding machines for cost effective and high volume production. Moreover, wire bond wires, whether ball bonded or wedge bonded, may be used to make good ground contacts without block surface signal routings between domains.

FIGS. 14-1 and 14-2 are block diagrams of a top-down view illustratively depicting respective exemplary wire bond wire patterns 191 and 192 for neighboring EMI isolation regions. With simultaneous reference to FIGS. 1 through 14-2, wire bond wire patterns 191 and 192 are further described. A row of wire bond wires 101B and a row of wire bond wires 101D may be back-to-back and spaced apart from one another. Having two or more rows of wire bond wires may be laid out to create concentric perimeters with an array of wires instead of lines of wire bond wires as illustratively depicted in the earlier figures, or a combination thereof.

In wire bond wire pattern 191, bases of wire bond wires 101B and 101D are horizontally- or vertically-aligned to one another, so gaps between wire bond wires 101B correspond to gaps between wire bond wires 101D. This arrangement or pattern may be useful for allowing direct surface routing to pass through fence-like EMI shield perimeters formed by wire bond wires 101B and 101D. In another implementation, wire bond wires 101B and/or 101D may include loop-like structures, such as open loop omega-like structures, as generally indicated with dashed lines 189.

In wire bond wire pattern 192, bases of wire bond wires 101B and 101D are offset-aligned to one another, so gaps between wire bond wires 101B correspond to bases of wire bond wires 101D, and gaps between wire bond wires 101D correspond to bases of wire bond wires 101B. This arrangement or pattern may be useful for having an overlapping and/or interspersing of wire bond wires with respect to EMI emissions to effectively provide a more dense mesh, for example by a combination of fence-like EMI shield perimeters formed by wire bond wires 101B and 101D.

Moreover, wire bond wires 101B and 101D may have same or different diameters, and may be made out of same or different materials. Pattern selection, as well as thickness and/or material selection, may be tailored to an application, such as may be associated with parameters of sources of EMI emission, including without limitation frequency of operation.

FIGS. 15-1 through 15-3 are block diagrams of a side view illustratively depicting respective exemplary wire bond wire patterns 193 and 194 for neighboring EMI isolation regions. With simultaneous reference to FIGS. 1 through 15-3, wire bond wire patterns 193 and 194 are further described. A row of wire bond wires 101B and a row of wire bond wires 101D may be back-to-back and spaced apart from one another, and both sets of these rows of wire bond wires may be slanted. Wire bond wires 101D are illustrated with dashed lines to indicate they are in back of wire bond wires 101B. An outer ring or other perimeter of an EMI cage may have wires slanted in one direction, while an inner ring or other perimeter of another EMI cage may be slanted in a second direction opposite the first direction. For example, such a second direction may be generally an opposite angle with respect to the angle in such a first direction in any of x, y, or z directions.

More particularly by way of non-limiting example, in left wire bond wire pattern 193, bases of wire bond wires 101B and 101D are horizontally- or vertically-aligned to one another, so gaps between wire bond wires 101B correspond to gaps between wire bond wires 101D. As mentioned above with reference to FIG. 10, this arrangement or pattern may be useful for allowing surface-based routing to pass through fence-like EMI shield perimeters formed by wire bond wires 101B and 101D. However, wire bond wires 101B and 101D are slanted in opposite directions in order to form a crosswise mesh for a combination of fence-like EMI shield perimeters formed by wire bond wires 101B and 101D.

Right wire bond pattern 193 is the same as left wire bond pattern, except bases of wire bond wires 101B and 101D are offset-aligned to one another, so gaps between wire bond wires 101B correspond to bases of wire bond wires 101D, and gaps between wire bond wires 101D correspond to bases of wire bond wires 101B. This arrangement or pattern may be useful for forming a bi-directional mesh for a combination of fence-like EMI shield perimeters formed by wire bond wires 101B and 101D.

In wire bond wire pattern 194, bases of wire bond wires 101B and 101D are offset-aligned to one another, so gaps between wire bond wires 101B correspond to bases of wire bond wires 101D, and gaps between wire bond wires 101D correspond to bases of wire bond wires 101B. This arrangement or pattern may be useful for forming a unidirectional mesh for a combination of fence-like EMI shield perimeters formed by wire bond wires 101B and 101D.

Figure 16:
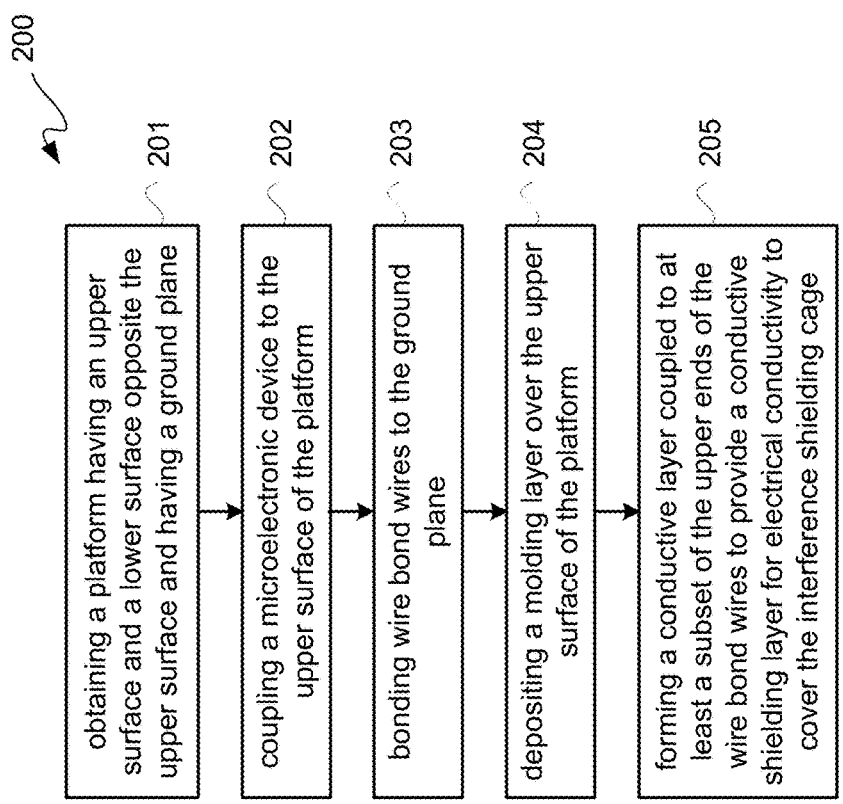
FIG. 16 is a flow diagram illustratively depicting a process for forming a microelectronic package having wire bond wire interference shielding.

FIG. 16 is a flow diagram illustratively depicting a EMI shield forming process 200 for forming a microelectronic package 100 having wire bond wires 101 for interference shielding for protection from EMI. Process 200 is further described with simultaneous reference to FIGS. 1 through 16.

At 201, a platform 104 is obtained having an upper surface 102 and a lower surface 106 opposite upper surface 102 and having a ground plane 107. At 202, a microelectronic device 105 is coupled to upper surface 102 of platform 104. At 203, wire bond wires 101 are wire bonded, such as ball, wedge or stitch bonded, for electrical interconnection with ground plane 107. Such wire bond wires 101 may have a pitch, as previously described. Wire bond wires 101 extend away from upper surface 102 of platform 104 with upper ends of wire bond wires 101 being above an upper surface of microelectronic device 105. Such wire bond wires 101 are spaced apart from one another to provide a fence-like perimeter to provide at least one interference shielding cage, such as previously described. At 204, a molding layer 113 may be deposited over upper surface 102 of platform 104, as previously described. At 205, a conductive layer may be formed, as previously described, for being coupled to at least a subset of upper ends of wire bond wires 101 for electrical conductivity to provide a conductive shielding layer 112 and/or 122 to cover such an interference shielding cage 111 and/or 121. Along those lines, operation 202 may be for coupling multiple microelectronic devices to an upper surface of a platform, and operation 203 may be for forming multiple wire bond perimeters, such as described elsewhere herein. Thus, at operation 205 one or more conductive layers may be formed.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An apparatus for protection from electromagnetic interference, comprising:
    a platform having an upper surface and a lower surface opposite the upper surface and having a ground plane;
    a first microelectronic device coupled to the upper surface of the platform;
    first wire bond wires coupled to the ground plane, the first wire bond wires having a first pitch;
    the first wire bond wires extending away from the upper surface of the platform with upper ends of the first wire bond wires extending above an upper surface of the first microelectronic device;
    the first wire bond wires spaced apart from one another to provide a first fence-like perimeter to provide a first interference shielding cage;
    a first conductive layer coupled to at least a subset of the upper ends of the first wire bond wires for electrical conductivity to provide a first conductive shielding layer to cover the first interference shielding cage;
    a second microelectronic device coupled to the platform and located outside of the first interference shielding cage;
    second wire bond wires coupled to the ground plane with a second pitch;
    the second wire bond wires extending away from the upper surface of the platform with upper ends of the second wire bond wires being above an upper surface of the second microelectronic device and the upper ends of the first wire bond wires;
    the second wire bond wires spaced apart from one another to provide a second fence-like perimeter to provide a second interference shielding cage;
    the first perimeter being within the second perimeter;
    a second conductive layer coupled to at least a subset of the upper ends of the second wire bond wires for electrical conductivity to at least provide a shield cover over the first interference shielding cage; and
    the second conductive layer overlapping the first conductive layer for having the first interference shielding cage within the second interference shielding cage.

2. The apparatus according to claim 1, wherein the first microelectronic device is shielded from the interference outside of the first interference shielding cage.

3. The apparatus according to claim 1, wherein the first microelectronic device is shielded by the first interference shielding cage to reduce spread of the interference generated by the first microelectronic device.

4. The apparatus according to claim 1, wherein the first conductive layer has an overhang extending beyond the first perimeter.

5. The apparatus according to claim 1, wherein at least a subset of the first wire bond wires have portions thereof with center-to-center spacing therebetween that is narrower than the first pitch.

6. The apparatus according to claim 5, wherein the first wire bond wires have an ꜧ-like shape.

7. The apparatus according to claim 5, wherein the first wire bond wires have a kinked or rounded shape.

8. The apparatus according to claim 1, wherein the first wire bond wires have a loop-like shape.

9. The apparatus according to claim 1, wherein the first perimeter has a shape corresponding to a layout of the first microelectronic device.

10. The apparatus according to claim 9, wherein the first perimeter has a contour or non-parallel sides shape.

11. The apparatus according to claim 9, wherein the first perimeter has a circular shape.

12. The apparatus according to claim 1, wherein the platform is selected from a leadframe, a circuit board, a substrate, and a redistribution layer.

13. The apparatus according to claim 1, wherein the first microelectronic device is coupled to the second microelectronic device though a gap between the first wire bond wires in the first interference shielding cage.

14. The apparatus according to claim 13, wherein the first microelectronic device is a stronger electromagnetic interference source than the second microelectronic device.

15. The apparatus according to claim 1, wherein the first conductive layer defines a ring-like hole therein having a pad therein isolated from a remainder of the first conductive layer by the ring-like hole.

16. The apparatus according to claim 1, wherein the first conductive layer is a ground plane.

17. A method for protection from electromagnetic interference, comprising:
    obtaining a platform having an upper surface and a lower surface opposite the upper surface and having a ground plane;
    coupling a microelectronic device to the upper surface of the platform;
    bonding wire bond wires to the ground plane, the wire bond wires having a pitch;
    the wire bond wires extending away from the upper surface of the platform with upper ends of the wire bond wires being above an upper surface of the microelectronic device;
    the wire bond wires spaced apart from one another to provide a fence-like perimeter to provide an interference shielding cage;
    depositing a molding layer over the upper surface of the platform; and
    forming a conductive layer coupled to at least a subset of the upper ends of the wire bond wires to provide a conductive shielding layer for electrical conductivity to cover the interference shielding cage;

wherein the microelectronic device is a first microelectronic device, the apparatus further comprising a second microelectronic device coupled to the platform and located outside of the interference shielding cage;

wherein the wire bond wires having the pitch are first wire bond wires having a first pitch, wherein the interference shielding cage is a first interference shielding cage having a first perimeter, and wherein the conductive layer is a first conductive layer, the method further comprising:

bonding second wire bond wires to the ground plane with a second pitch;

the second wire bond wires extending away from the upper surface of the platform with upper ends of the second wire bond wires being above an upper surface of the second microelectronic device and the upper ends of the first wire bond wires;

the second wire bond wires spaced apart from one another to provide a second fence-like perimeter to provide a second interference shielding cage;

the first perimeter being within the second perimeter; and forming a second conductive layer coupled to at least a subset of the upper ends of the second wire bond wires for electrical conductivity to at least provide a shield cover over the first interference shielding cage and the second interference shielding cage including overlapping the first conductive layer for having the first interference shielding cage within the second interference shielding cage.

18. The method according to claim 17, further comprising forming at least a subset of the first wire bond wires have portions thereof with center-to-center spacing therebetween narrower than the first pitch.

19. The method according to claim 17, further comprising forming a trace on the upper surface of the platform for coupling the first microelectronic device to the second microelectronic device, the trace extending though a gap between the first wire bond wires of the first interference shielding cage.

20. The method according to claim 17, wherein:

the first conductive layer defines a ring-like hole therein; and the first conductive layer includes a pad in the ring-like hole electrically isolated from a remainder of the first conductive layer by the ring-like hole.

* * * * *